US010211366B2

(12) United States Patent
Wu et al.

(10) Patent No.: US 10,211,366 B2
(45) Date of Patent: Feb. 19, 2019

(54) SELF-EMISSION TYPE DISPLAY AND REPAIRING METHOD THEREOF

(71) Applicant: AU Optronics Corporation, Hsin-Chu (TW)

(72) Inventors: Tsung-Tien Wu, Hsin-Chu (TW); Pin-Miao Liu, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/405,634

(22) Filed: Jan. 13, 2017

(65) Prior Publication Data

US 2017/0229608 A1   Aug. 10, 2017

(30) Foreign Application Priority Data

Feb. 5, 2016  (TW) .............................. 105103970 A

(51) Int. Cl.
*H01L 33/62* (2010.01)
*H01L 33/00* (2010.01)
(Continued)

(52) U.S. Cl.
CPC ........ *H01L 33/0095* (2013.01); *H01L 25/167* (2013.01); *H01L 27/156* (2013.01);
(Continued)

(58) Field of Classification Search
CPC ............... H01L 27/156; H01L 27/1214; H01L 27/3244; H01L 33/0095; H01L 33/38;
(Continued)

(56) References Cited

U.S. PATENT DOCUMENTS

| 6,943,374 | B1 | 9/2005 | Park |
| 2005/0110020 | A1* | 5/2005 | Hayashi ................. H01L 27/12 |
| | | | 257/72 |
| 2014/0063398 | A1* | 3/2014 | Chang ............... G02F 1/136259 |
| | | | 349/54 |

FOREIGN PATENT DOCUMENTS

JP   H09244048 A   9/1997

OTHER PUBLICATIONS

State Intellectual Property Office of the People's Republic of China , "Office Action", dated Feb. 1, 2018.

* cited by examiner

*Primary Examiner* — Jami V Miller
(74) *Attorney, Agent, or Firm* — WPAT, PC

(57) ABSTRACT

The present invention proposes a self-emission type display and a repairing method thereof. The self-emission type display includes a carrier substrate and a light-emitting element. The carrier substrate includes a first electrode, a second electrode, and a plurality of repairing electrodes. The first electrode has a plurality of first strip portions connected to a first level. The second electrode has a plurality of second strip portions connected to a second level. The first electrode is separated from the second electrode, and the first level is different from the second level. The repairing electrodes are electrically insulated from the first electrode and the second electrode. The light-emitting element is disposed on the carrier substrate and has a first connecting portion and a second connecting portion. The first connecting portion is electrically connected to the first level through the first strip portions. The second connecting portion is electrically connected to the second level through the second strip portions.

10 Claims, 21 Drawing Sheets

(51) Int. Cl.
    *H01L 25/16*     (2006.01)
    *H01L 27/15*     (2006.01)
    *H01L 33/38*     (2010.01)
    *H01L 33/44*     (2010.01)
    *H01L 27/12*     (2006.01)
    *H01L 25/075*     (2006.01)

(52) U.S. Cl.
    CPC ............ *H01L 33/38* (2013.01); *H01L 33/385* (2013.01); *H01L 33/44* (2013.01); *H01L 33/62* (2013.01); *H01L 25/0753* (2013.01); *H01L 27/1214* (2013.01); *H01L 2933/0016* (2013.01); *H01L 2933/0025* (2013.01); *H01L 2933/0066* (2013.01)

(58) Field of Classification Search
    CPC ..... H01L 33/385; H01L 33/387; H01L 33/44; H01L 25/167; H01L 21/4889; H01L 2251/568; H01L 25/156; H01L 2933/0016; H01L 2933/0066; H01L 33/62
    USPC ................................ 257/88–93, 99; 313/505
    See application file for complete search history.

SELF-EMISSION TYPE DISPLAY AND REPAIRING METHOD THEREOF

BACKGROUND

Technical Field

The present invention relates to a self-emission type display, and in particular, to a self-emission type display having the repairing electrodes.

Related Art

With the development of semiconductor technologies, nowadays light-emitting diodes (LED) already have high-brightness output, and in addition, with advantages such as that LEDs are power saving, have small volumes, are driven by low voltage, and do not contain mercury, LEDs have found wide application in fields such as displays and lighting, so that a self-emission type display is formed.

Generally, in a self-emission type display, an LED is mounted on a substrate in a manner of transfer by using a mechanical apparatus or a stamp (PDMS). However, problems of alignment and precision exist in a process of transfer, causing that an LED cannot be correctly connected to an electrode, which reduces a yield of a self-emission type display.

SUMMARY

The present invention provides a self-emission type display, which can effectively repair an abnormality in mounting of the light-emitting element, so as to increase a yield of a self-emission type display.

The present invention provides a self-emission type display, including a carrier substrate and a light-emitting element. The carrier substrate includes a first electrode, a second electrode, and a plurality of repairing electrodes. The first electrode has a plurality of first strip portions connected to a first level. The second electrode has a plurality of second strip portions connected to a second level. The first electrode is separated from the second electrode, and the first level is different from the second level. The repairing electrodes are electrically insulated from the first electrode and the second electrode. The light-emitting element is disposed on the carrier substrate, and the light-emitting element has a first connecting portion and a second connecting portion. The first connecting portion of the light-emitting element is electrically connected to the first level through the first strip portions. The second connecting portion of the light-emitting element is electrically connected to the second level through the second strip portions.

The present invention provides a self-emission type display, including a carrier substrate and a light-emitting element. The carrier substrate includes a first electrode, a second electrode, and a plurality of repairing electrodes. The first electrode has a plurality of first strip portions connected to a first level. The second electrode has a plurality of second strip portions connected to the second level. The first electrode is separated from the second electrode, and the first level is different from the second level. At least one repairing electrode is welded to the second electrode. The light-emitting element is disposed on the carrier substrate, and the light-emitting element has a first connecting portion and a second connecting portion. The first connecting portion of the light-emitting element is electrically connected to the first level through the first strip portions. The second connecting portion of the light-emitting element is electrically connected to the second level through at least one repairing electrode.

The present invention provides a self-emission type display, including a carrier substrate and a light-emitting element. The carrier substrate includes a first electrode, a second electrode, a plurality of first repairing electrodes, and a plurality of second repairing electrodes. The first electrode has a plurality of first strip portions connected to a first level. The second electrode has a plurality of second strip portions connected to the second level. The first electrode is separated from the second electrode, and the first level is different from the second level. The first repairing electrodes are electrically connected to the first electrode. The second repairing electrodes are electrically connected to the second electrode. The light-emitting element is disposed on the carrier substrate, and the light-emitting element has a first connecting portion and a second connecting portion. The first connecting portion of the light-emitting element is electrically connected to the first level through the first repairing electrodes and the first electrode. The second connecting portion of the light-emitting element is electrically connected to the second level through the second repairing electrodes and the second electrode.

The present invention provides a self-emission type display, including a carrier substrate and a light-emitting element. The carrier substrate includes a first electrode, a second electrode, a plurality of first repairing electrodes, and a plurality of second repairing electrodes. The first electrode has a plurality of first strip portions connected to a first level. The second electrode has a plurality of second strip portions connected to the second level. The first electrode is separated from the second electrode, and the first level is different from the second level. The light-emitting element is disposed on the carrier substrate, and the light-emitting element has a first connecting portion and a second connecting portion. The first connecting portion of the light-emitting element is electrically connected to the first level through the first strip portions. A first repairing electrode overlapped with the second connecting portion of the light-emitting element is electrically insulated from the first electrode and is welded to the second electrode. The second connecting portion of the light-emitting element is electrically connected to the second level through the first repairing electrode welded to the second electrode.

The present invention provides a method for repairing a self-emission type display, including: first providing a carrier substrate, the carrier substrate having a first electrode, a second electrode, and a plurality of repairing electrodes, where the first electrode includes a plurality of first strip portions connected to a first level, and the second electrode includes a plurality of second strip portions connected to a second level; next, forming a light-emitting element on the carrier substrate, where the light-emitting element has a first connecting portion and a second connecting portion, and the first connecting portion is electrically connected to at least one first strip portion; subsequently, performing a connection procedure, to enable a repairing electrode electrically connected to the second connecting portion of the light-emitting element to be electrically connected to the second electrode; and next, performing a removal procedure, to enable a first strip portion overlapped with the second connecting portion of the light-emitting element to be electrically insulated from the first electrode.

Based on the above, because the self-emission type display of the present invention has a plurality of repairing electrodes, when an LED has a mounting alignment error, the repairing electrodes can be used to enable the LED to be correctly connected to an electrode line. Therefore, a scrap rate of self-emission type displays can be reduced, and a manufacturing yield can be increased.

To make the above features and advantages of the present invention more comprehensible, detailed description is provided below by using embodiments in the following with reference to the accompanying drawings.

DETAILED DESCRIPTION

Figure 1A:
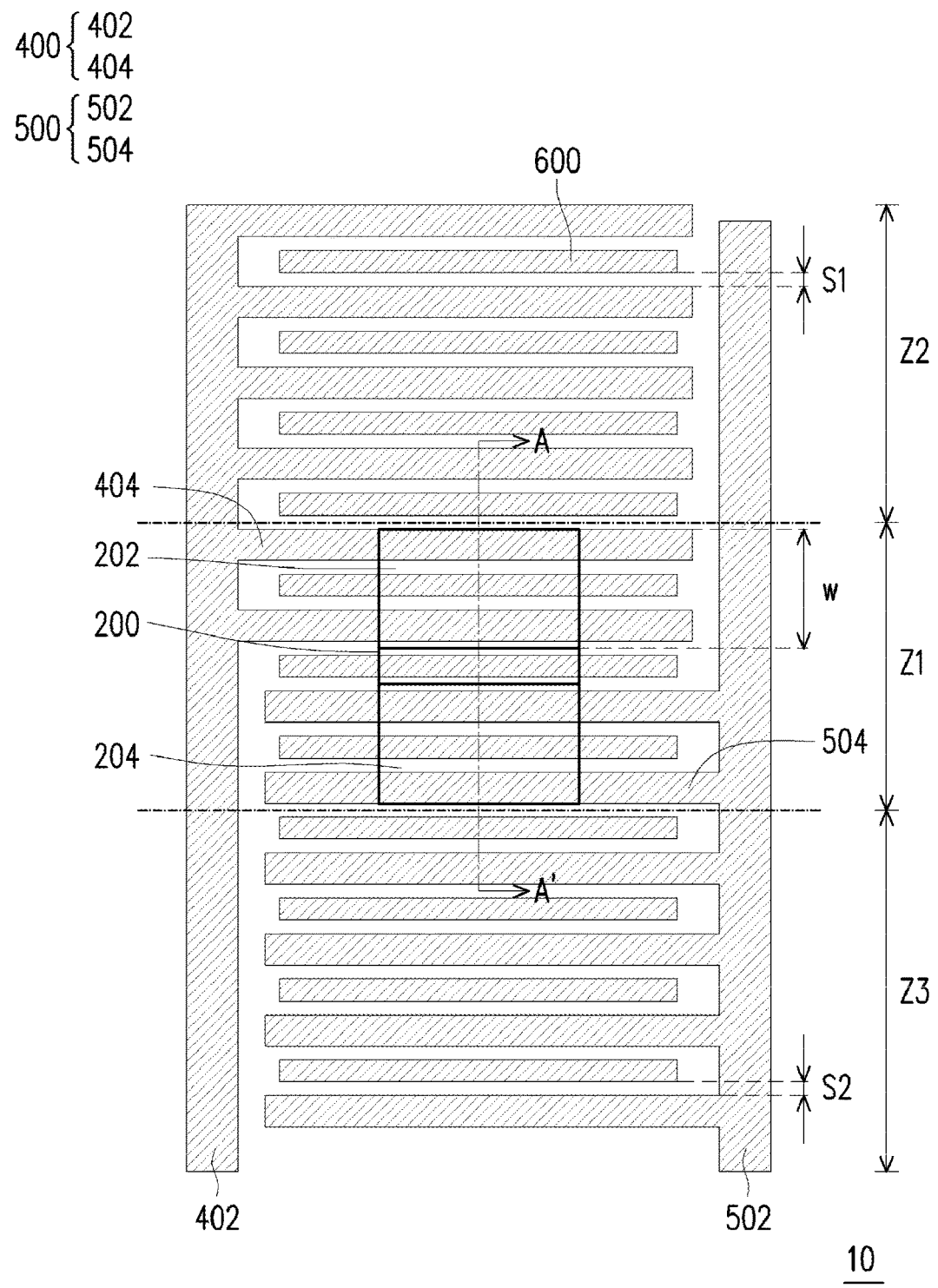
FIG. 1A is a schematic top view of a self-emission type display according to an embodiment of the present invention.
Figure 1B:
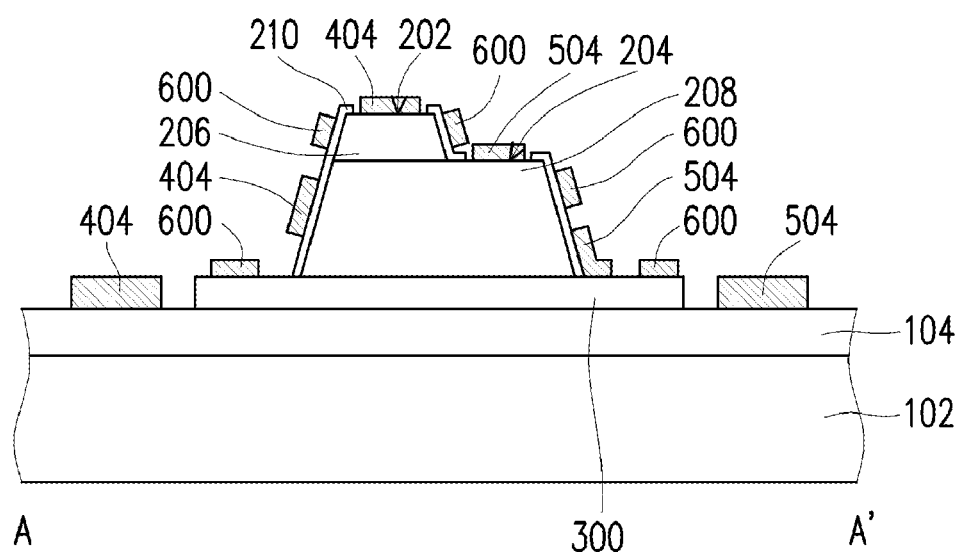
FIG. 1B is a schematic sectional view of a sectional line A-A' according to the self-emission type display in FIG. 1A.

FIG. 1A is a schematic top view of a self-emission type display 10 according to an embodiment of the present invention. FIG. 1B is a schematic sectional view along a sectional line A-A' according to the self-emission type display in FIG. 1A. Referring to both FIG. 1A and FIG. 1B, the self-emission type display 10 includes a carrier substrate 100 and a light-emitting element 200. In this embodiment, the carrier substrate 100 includes an active element array substrate 102, a passivation layer 104, an adhesion layer 300, a first electrode 400, a second electrode 500, and repairing electrodes 600.

The active element array substrate 102 may include a plurality of scan lines, a plurality of data lines, and a plurality of active elements (not shown) electrically connected to the scan lines and the data lines. The active element may be a bottom-gate-type thin film transistor or a top-gate-type thin film transistor, and includes a gate, a channel, a source, and a drain. In this embodiment, by using the gate-type thin film transistor, the active element array substrate 102 can provide a first level V1 to another element; however, the present invention is not limited thereto. In another embodiment, the active element array substrate 102 may include another similar active element, as long as the active element array substrate 102 can provide the first level V1.

The passivation layer 104 is disposed on the active element array substrate 102, and a material of the passivation layer 104 may be an inorganic material (for example, silicon oxide, silicon nitride, silicon nitroxide, another suitable material, or a stack layer of at least two materials of the above), an organic material, another suitable material, or a combination of the above materials.

The adhesion layer 300 is disposed between the light-emitting element 200 and the passivation layer 104, so as to fix the light-emitting element 200 on the carrier substrate 100. The adhesion layer 300 may be a transparent adhesion layer or a non-transparent adhesion layer. Specifically, it may be selected in consideration of a light-emitting direction of the light-emitting element 200 to adjust a material of the adhesion layer 300. In this embodiment, the light-emitting element 200 is, for example, an LED. The light-emitting element 200 has a first connecting portion 202, a second connecting portion 204, a first-type semiconductor layer 206, a second-type semiconductor layer 208, and a light-emitting element insulation layer 210, where the first connecting portion 202 is connected to the first-type semiconductor layer 206, and the second connecting portion 204 is connected to the second-type semiconductor layer 208. Specifically, in this embodiment, for the first-type semiconductor layer 206, a P-type semiconductor layer is used as an example, and for the second-type semiconductor layer 208, an N-type semiconductor layer is used as an example; however, the present invention is not limited thereto. In another embodiment, forms of the semiconductor layers may also be exchanged, as long as the first-type semiconductor layer 206 and the second-type semiconductor layer 208 are semiconductor layers in different forms. A material of the P type semiconductor layer is, for example, amorphous silicon or microcrystalline silicon, and a doped material in the P type semiconductor layer is, for example, selected from the group IIIA elements in the periodic table of the chemical elements, and is, for example, boron (B), aluminum (Al), gallium (Ga), indium (In) or thallium (Tl). In another aspect, a material of the N type semiconductor layer is, for example, amorphous silicon or microcrystalline silicon, and a doped material of the N type semiconductor layer is, for example, selected from the group VA elements in the periodic table of the chemical elements, and is, for example, phosphor (P), arsenic (As), antimony (Sb) or bismuth (Bi). In this embodiment, the light-emitting element insulation layer 210 is covered on the first-type semiconductor layer 206 and the second-type semiconductor layer 208, and a part of the first-type semiconductor layer 206 and a part of the second-type semiconductor layer 208 are exposed, to form the first connecting portion 202 and the second connecting portion 204. In other words, in this embodiment, the first connecting portion 202 and the second connecting portion 204 are respectively parts of the first-type semiconductor layer 206 and the second-type semiconductor layer 208; however, the present invention is not limited thereto. In another embodiment, the first connecting portion 202 and the second connecting portion 204 may also be another conductive element disposed on the first-type semiconductor layer 206 and the second-type semiconductor layer 208. In another aspect, a material of the light-emitting element insulation layer 210 includes an inorganic material (for example, silicon oxide, silicon nitride, silicon nitroxide, another suitable material, or a stack layer of at least two materials of the above), an organic material, or another suitable material, or a combination of the above. In addition, in this embodiment, the first connecting portion 202 and the second connecting portion 204 are of a long strip type. Specifically, the first connecting portion 202 and the second connecting portion 204 extend along a side of the light-emitting element 200 to form such a long strip type, so as to increase a contact area.

In this embodiment, the first electrode 400 and the second electrode 500 are separate from each other and cover the light-emitting element 200. Materials of the first electrode 400 and the second electrode 500 may be a single-layer or multi-layer stack structure of low-resistance conductive materials, which include gold, copper, titanium, aluminum, chromium, platinum, another conductive material or a combination of these materials. In another aspect, the materials of the first electrode 400 and the second electrode 500 may further include metal oxide, for example, indium tin oxide, indium zinc oxide, aluminum tin oxide, aluminum zinc oxide, indium germanium zinc oxide, or another suitable metal oxide. The first electrode 400 has a first body portion 402 and a plurality of first strip portions 404, and the second electrode 500 has a second body portion 502 and a plurality of second strip portions 504. The first strip portions 404 are connected to the first body portion 402, and the second strip portions 504 are connected to the second body portion 502. The first electrode 400 may be directly electrically connected to the active element array substrate 102 that provides the first level V1. Specifically, the first electrode 400 may be electrically connected to the drain of the active element in the active element array substrate 102, to have the first level V1. For example, the first electrode 400 may be electrically connected to the active element array substrate 102 by using a connection electrode (not shown) penetrating the passivation layer 104. In another aspect, the first electrode 400 may also directly penetrate the passivation layer 104 to be electrically connected to the active element array substrate 102. However, a manner in which the first electrode 400 is connected to the active element array substrate 102 is not specifically limited in the present invention, as long as the first electrode 400 can have the first level V1 through the active element array substrate 102. The second electrode 500 is connected to a second level V2 different from the first level V1. Specifically, in this embodiment, the second level V2 is a common potential $V_{ss}$, and the first level V1 is greater than the second level V2.

The first strip portions 404 of the first electrode 400 extend on a plane of the adhesion layer 300 or the passivation layer 104 along a side surface of the light-emitting element 200 to a top surface of the light-emitting element 200 and are electrically connected to the first connecting portion 202. In other words, by using the extending first strip portions 404, the first level V1 can be provided to the first connecting portion 202 of the light-emitting element 200. Similarly, the second strip portions 504 of the second electrode 500 extend on the plane of the adhesion layer 300 or the passivation layer 104 along the side surface of the light-emitting element 200 to the top surface of the light-emitting element 200 and are electrically connected to the second connecting portion 204. In other words, by using the extending second strip portions 504, the second level V2 can be provided to the second connecting portion 204 of the light-emitting element 200. Therefore, by providing two different levels to the light-emitting element 200, the light-emitting element 200 is enabled to generate an effect of electron-hole combination, so as to release light energy.

In another aspect, the self-emission type display in this embodiment further includes the repairing electrodes 600. The repairing electrodes 600 is formed simultaneously with the first electrode 400 and the second electrode 500, and therefore the first electrode 400, the second electrode 500, and the repairing electrodes 600 are on a same film layer. However, the repairing electrodes 600 are electrically insulated from the first electrode 400 and the second electrode 500. In other words, the repairing electrodes 600 present a floating state. In this embodiment, a part of the repairing electrodes 600 are located between adjacent first strip portions 404, and a part of the repairing electrodes 600 are located between adjacent second strip portions 504. In addition, further a part of the repairing electrodes 600 are located between the first strip portions 404 and the second strip portions 504 that are adjacent, as shown in FIG. 1A. In other words, the repairing electrodes 600 and the first strip portions 404 present a staggered arrangement, and the repairing electrodes 600 and the second strip portions 504 also present a staggered arrangement. A distance S1 is provided between the repairing electrodes 600 and a closely adjacent first strip portion 404, and a distance S2 is provided between the repairing electrodes 600 and a closely adjacent second strip portion 504. The first connecting portion 202 and the second connecting portion 204 of the light-emitting element 200 respectively have a width w, and in this embodiment, a configuration of the repairing electrodes 600 meets a condition of w≥S1 and w≥S2, to enable the repairing electrodes 600 to be overlapped with the first connecting portion 202 and the second connecting portion 204, so that a repairing effect can be achieved for an offset. A material of the repairing electrodes 600 may be the same as or different from the first electrode 400 and the second electrode 500. In other words, the repairing electrodes 600 may be a single-layer or multi-layer stack structure of low-resistance conductive materials, which include gold, copper, titanium, aluminum, chromium, platinum, another conductive material or a combination of these materials. In another aspect, a material of the repairing electrodes 600 may further include metal oxide, for example, indium tin oxide, indium zinc oxide, aluminum tin oxide, aluminum zinc oxide, indium germanium zinc oxide, or another suitable metal oxide.

The self-emission type display 10 may be divided into a non-offset area Z1, an upward offset area Z2, and a downward offset area Z3. Referring to FIG. 1A again, when the light-emitting element 200 is mounted in the non-offset area Z1, the first strip portions 404 of the first electrode 400 is electrically connected to the first connecting portion 202, and the second strip portions 504 of the second electrode 500 is electrically connected to the second connecting portion 204. In this case, the light-emitting element 200 can emit a light ray under the effect of a first voltage V1 and a second voltage V2. However, when the light-emitting element 200 is mounted in the upward offset area Z2 or the downward offset area Z3, an abnormality occurs in the light-emitting element 200, and therefore a repairing procedure needs to be performed. A repairing manner in a case of a mounting offset in the light-emitting element 200 is described in detail below.

Figure 1C:
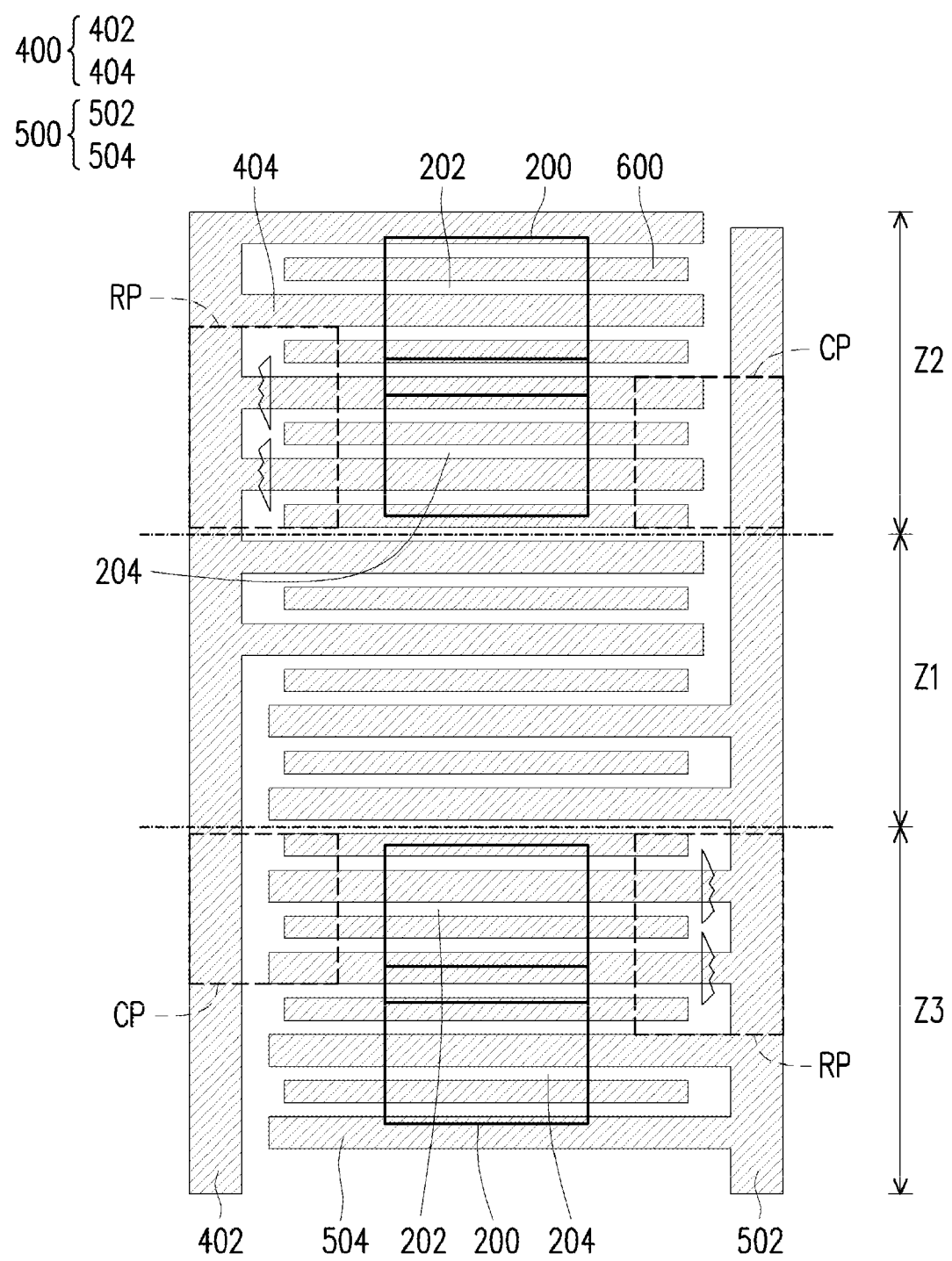
FIG. 1C is a schematic view of a method for repairing the self-emission type display in FIG. 1A.

FIG. 1C is a schematic view of a method for repairing the self-emission type display 10 shown in FIG. 1A. Referring to FIG. 1C, when the light-emitting element 200 is mounted in the upward offset area Z2, the first strip portions 404 of the first electrode 400 are electrically connected to the first connecting portion 202 and the second connecting portion 204 of the light-emitting element 200 respectively. In such a case, only the first voltage V1 is provided to the light-emitting element 200, and therefore, a problem of a short circuit occurs, causing that the light-emitting element 200 cannot successfully emit light. Therefore, the self-emission type display 10 can be repaired by using the repairing electrodes 600. First, a removal procedure is performed first, to enable first strip portions 404 overlapped with the second connecting portion 204 of the light-emitting element 200 to be electrically insulated from the first electrode 400. Specifically, the first strip portions 404 and the first body portion 402 in a removal area RP may be cut apart by using a laser cutting procedure, to enable the first strip portions 404 in the removal area RP to be electrically insulated from the first body portion 402. Next, a connection procedure is performed, to enable repairing electrodes 600 overlapped with the second connecting portion 204 of the light-emitting element 200 to be electrically connected to the second electrode 500. In this embodiment, the connection procedure includes a laser welding procedure. Specifically, in the laser welding procedure, an opening may be first formed in a protection layer (not shown) on the repairing electrodes 600 in a connection area CP and the second electrode 500 by using a laser, to expose the repairing electrodes 600 located in the connection area CP and the second body portion 502 of the second electrode 500. Subsequently, a laser chemical vapor deposition procedure is then performed, to form a thin metal layer to connect the repairing electrodes 600 and the second body portion 502. It should be noted that, in this embodiment, an example in which the removal procedure is performed first and the connection procedure is then performed is used; however, the present invention is not limited thereto. In another embodiment, the connection procedure may also be performed first and the removal procedure is then performed. In addition, in this embodiment, methods of laser cutting and laser welding are used as an example; however, the present invention does not specifically limit manners of connection and removal. Other common manners of connection and removal in this field may also be configured in the present invention.

After repairing, the first strip portions 404 of the first electrode 400 is electrically connected to the first connecting portion 202 of the light-emitting element 200, and the second electrode 500 is electrically connected to the second connecting portion 204 through the repairing electrodes 600 welded to the second electrode 500. In other words, after repairing, the first connecting portion 202 is only electrically connected to the first electrode 400, and the second connecting portion 204 is only electrically connected to the second electrode 500. Therefore, the light-emitting element 200 can emit a light ray by using a first voltage V1 provided by the first electrode 400 and a second voltage V2 provided by the second electrode 500 and the repairing electrodes 600.

Similarly, when the light-emitting element 200 is mounted in the downward offset area Z3, the second strip portions 504 of the second electrode 500 is electrically connected to the first connecting portion 202 and the second connecting portion 204 of the light-emitting element 200 respectively. In such a case, only the second voltage V2 is provided to the light-emitting element 200, and therefore, a problem of a short circuit occurs, causing that the light-emitting element 200 cannot successfully emit light. Therefore, the self-emission type display 10 may be repaired by using a removal procedure and a connection procedure that are similar to the foregoing. First, the removal procedure is performed first, to enable the second strip portions 504 overlapped with the first connecting portion 202 of the light-emitting element 200 to be electrically insulated from the second electrode 500 in the removal area RP. Next, the connection procedure is performed, to enable the repairing electrodes 600 overlapped with the first connecting portion 202 of the light-emitting element 200 to be electrically connected to the first electrode 400 in the connection area CP.

After repairing, the second strip portions 504 of the second electrode 500 is electrically connected to the second connecting portion 204 of the light-emitting element 200, and the first electrode 400 is electrically connected to the first connecting portion 202 through the repairing electrodes 600 welded to the first electrode 400. In other words, after repairing, the first connecting portion 202 is only electrically connected to the first electrode 400, and the second connecting portion 204 is only electrically connected to the second electrode 500. Therefore, the light-emitting element 200 can emit a light ray by using a first voltage V1 provided by the first electrode 400 and a second voltage V2 provided by the second electrode 500 and the repairing electrodes 600.

In this embodiment, when the light-emitting element 200 has a mounting alignment error, the repairing electrodes 600 can be used to enable the light-emitting element 200 to be correctly connected to an electrode line, so that a manufacturing yield can be increased.

Figure 2A:
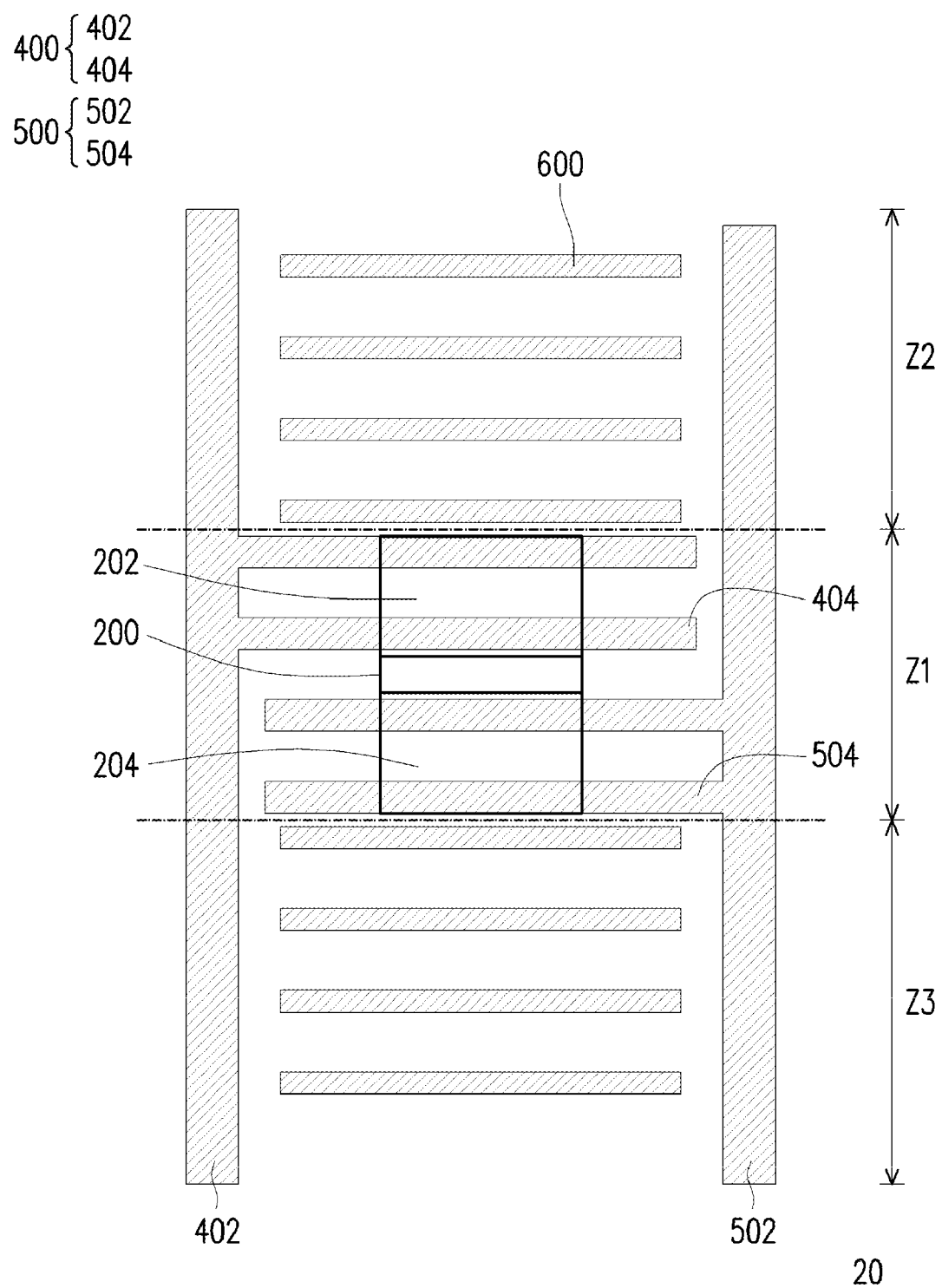
FIG. 2A is a schematic top view of a self-emission type display according to another embodiment of the present invention.
Figure 2B:
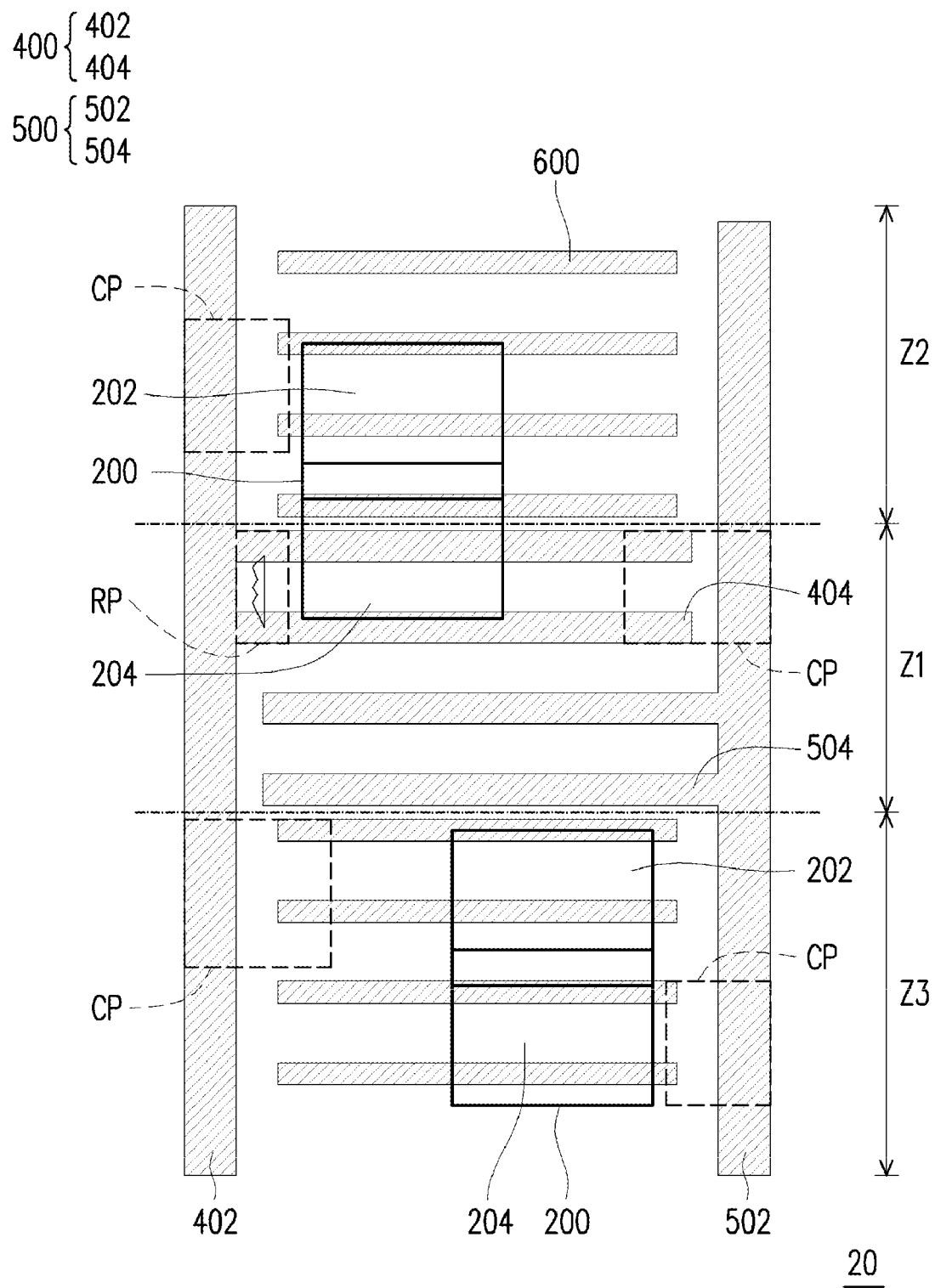
FIG. 2B is a schematic view of a method for repairing the self-emission type display in FIG. 2A.

FIG. 2A is a schematic top view of a self-emission type display 20 according to another embodiment of the present invention. FIG. 2B is a schematic view of a method for repairing the self-emission type display 20 in FIG. 2A. The self-emission type display in this embodiment 20 is similar to the embodiment in FIG. 1A to FIG. 1C, and therefore the same elements are represented by the same symbols, and description is no longer repeated. A difference between this embodiment and the embodiment in FIG. 1A to FIG. 1C lies in that first strip portions 404 and second strip portions 504 in this embodiment are only located in a non-offset area Z1, whereas repairing electrodes 600 are only located in an upward offset area Z2 and a downward offset area Z3.

Referring to FIG. 2B, because the upward offset area Z2 and the downward offset area Z3 do not have the first strip portions 404 and the second strip portions 504, when the light-emitting element 200 is completely offset into the upward offset area Z2 or the downward offset area Z3, a connection procedure is performed on only repairing electrodes 600 overlapped with a first connecting portion 202 and repairing electrodes 600 overlapped with a second connecting portion 204 respectively. In other words, by using the connection procedure, repairing electrodes 600 in a connection area CP are welded to the first body portion 402 or the second body portion 502. In another aspect, the connection procedure and the removal procedure need to be performed at the same time only when a part of the light-emitting element 200 is offset to the upward offset area Z2 or the downward offset area Z3 and another part is still located in the non-offset area Z1.

Similar to the embodiment in FIG. 1A to FIG. 1C, in this embodiment, when the light-emitting element 200 has a mounting alignment error, the repairing electrodes 600 can be used to enable the light-emitting element 200 to be correctly connected to an electrode line, so that a manufacturing yield can be increased.

Figure 3A:
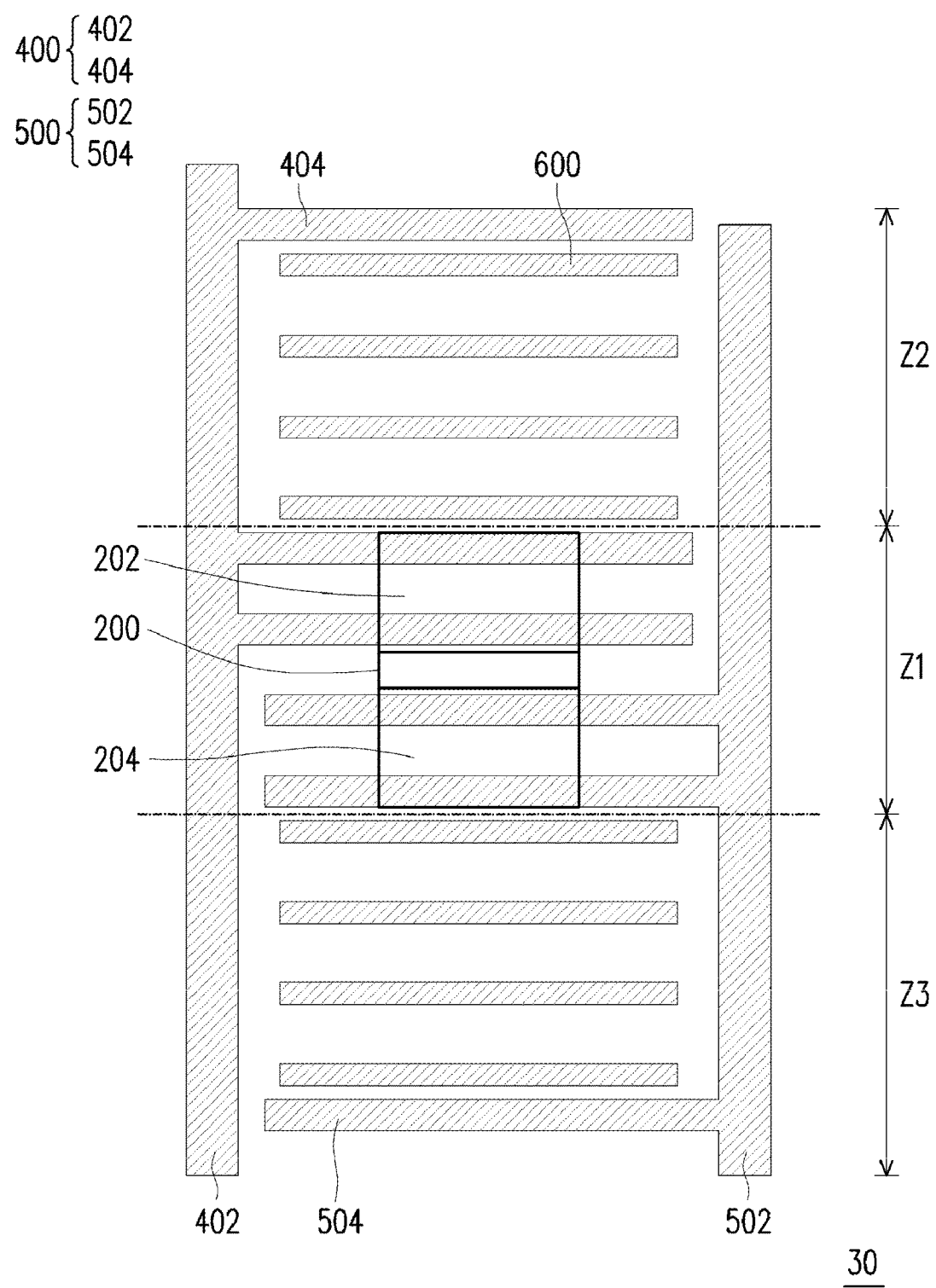
FIG. 3A is a schematic top view of a self-emission type display according to still another embodiment of the present invention.
Figure 3B:
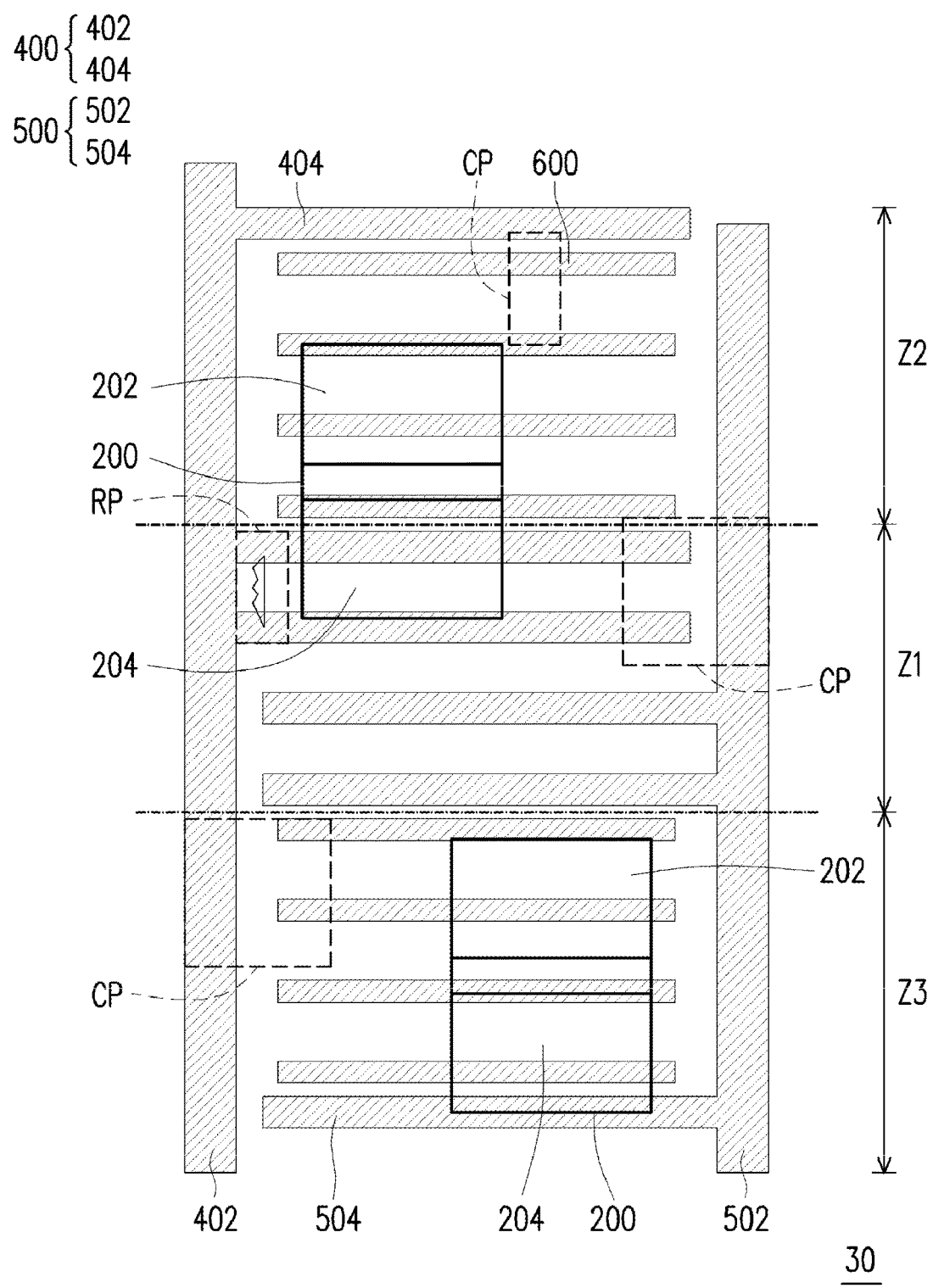
FIG. 3B is a schematic view of a method for repairing the self-emission type display in FIG. 3A.

FIG. 3A is a schematic top view of a self-emission type display 30 according to still another embodiment of the present invention. FIG. 3B is a schematic view of a method for repairing the self-emission type display 30 in FIG. 3A.

The self-emission type display 30 in this embodiment is similar to the embodiment in FIG. 2A and FIG. 2B, and therefore, the same elements are represented by the same symbols, and description is no longer repeated. A difference between this embodiment and the embodiment in FIG. 2A and FIG. 2B lies in that in this embodiment, there are also first strip portions 404 and second strip portions 504 in an upward offset area Z2 and a downward offset area Z3. In this embodiment, in addition to that repairing electrodes 600 in a connection area CP are welded to a first body portion 402 or a second body portion 502 by using a connection procedure, the repairing electrodes 600 in the connection area CP may also be welded to the first strip portions 404 or the second strip portions 504, as shown in FIG. 3B. In other words, a repairing procedure only needs to enable the first connecting portion 202 of the light-emitting element 200 to be electrically connected to the first electrode 400 and to enable the second connecting portion 204 to be electrically connected to the second body portion 502.

Similar to the embodiment in FIG. 2A and FIG. 2B, in this embodiment, when the light-emitting element 200 has a mounting alignment error, the repairing electrodes 600 can be used to enable the light-emitting element 200 to be correctly connected to an electrode line, so that a manufacturing yield can be increased.

Figure 4A:
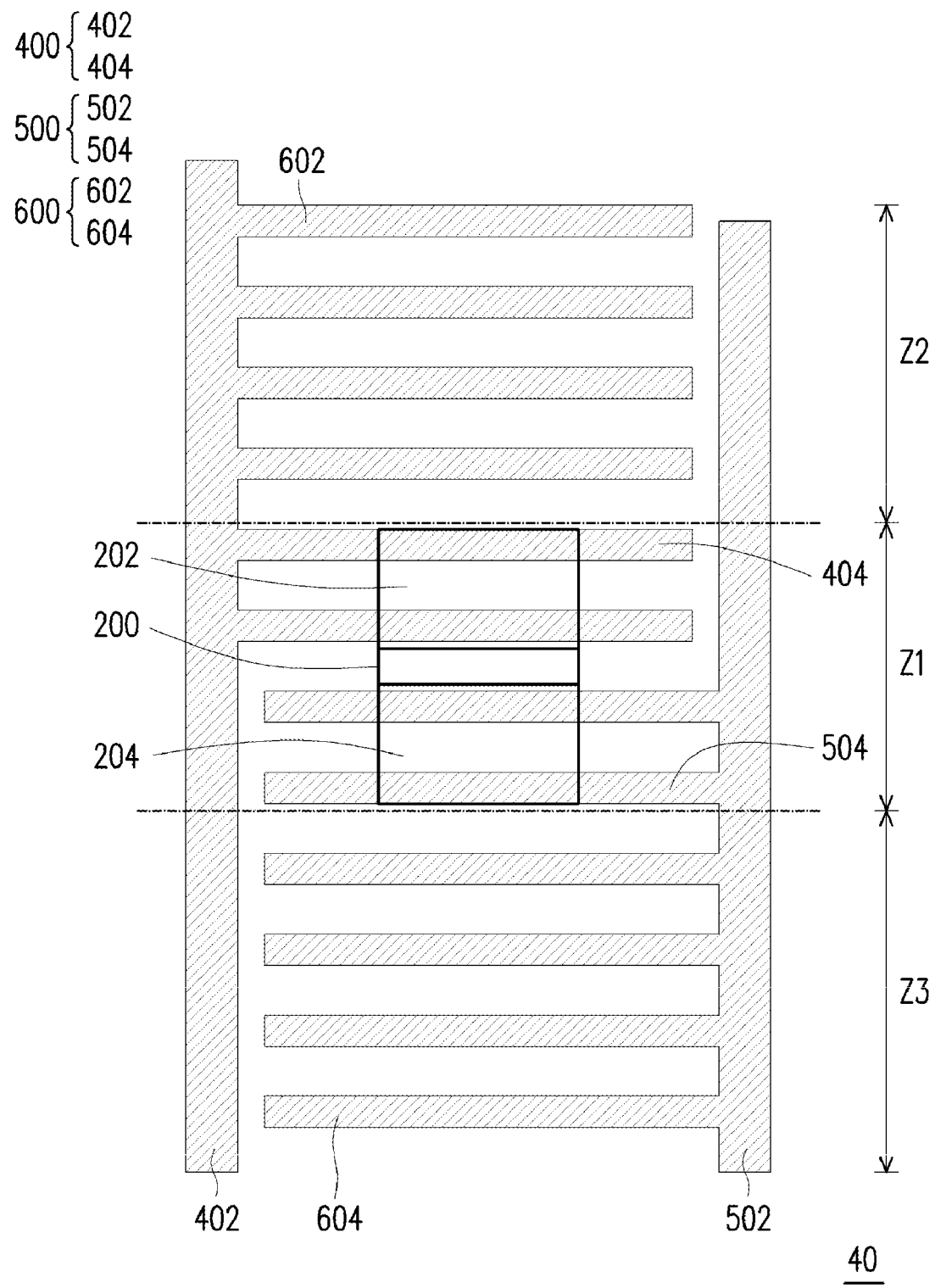
FIG. 4A is a schematic top view of a self-emission type display according to yet another embodiment of the present invention.
Figure 4B:
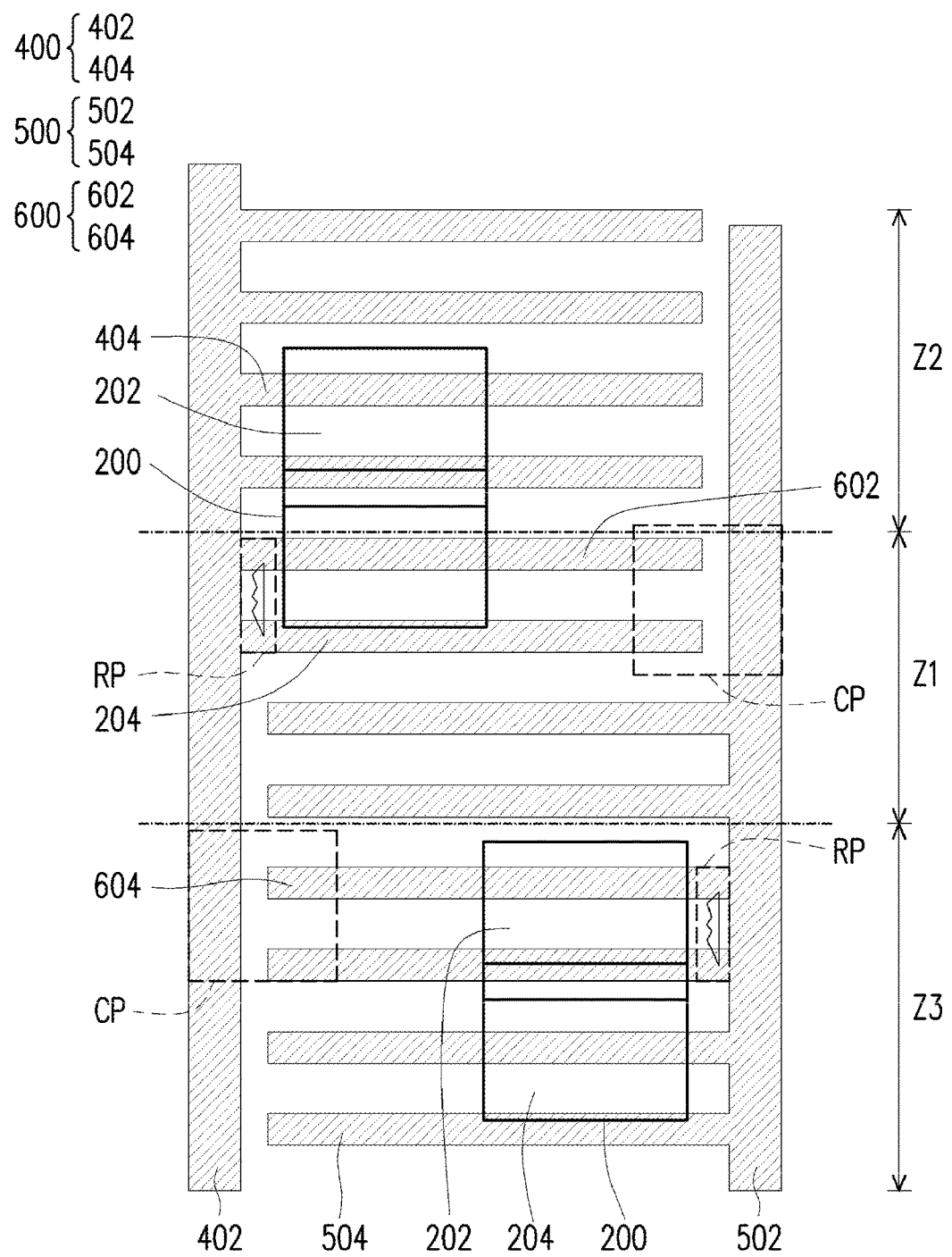
FIG. 4B is a schematic view of a method for repairing the self-emission type display in FIG. 4A.

FIG. 4A is a schematic top view of a self-emission type display 40 according to yet another embodiment of the present invention. FIG. 4B is a schematic view of a method for repairing the self-emission type display 40 in FIG. 4A. The self-emission type display 40 in this embodiment is similar to the embodiment in FIG. 1A to FIG. 1C, and therefore, the same elements are represented by the same symbols, and description is no longer repeated. A difference between this embodiment and the embodiment in FIG. 1A to FIG. 1C lies in that in this embodiment, repairing electrodes 600 do not present a floating state. Specifically, the repairing electrodes 600 in this embodiment include first repairing electrodes 602 and second repairing electrodes 604. The first repairing electrodes 602 are connected to a first body portion 402, and the second repairing electrodes 604 are connected to a second body portion 502. In other words, in this embodiment, a part of first strip portions 404 are used as the first repairing electrodes 602, and a part of second strip portions 504 are used as the second repairing electrodes 604.

Referring to FIG. 4B, in this embodiment, when the light-emitting element 200 is offset and needs to be repaired, a removal procedure may be directly performed on first strip portions 404 (the first repairing electrodes 602) or second strip portions 504 (the second repairing electrodes 604) in a removal area RP, to enable the first strip portions 404 in the removal area RP to be electrically insulated from the first body portion 402, and to enable the second strip portions 504 in the removal area RP to be electrically insulated from the second body portion 502. In another aspect, a connection procedure may be directly performed on first strip portions 404 (the first repairing electrodes 602) or second strip portions 504 (the second repairing electrodes 604) in a connection area CP, to enable the first strip portions 404 in the connection area CP to be electrically connected to the second body portion 502, and to enable the second strip portions 504 in the connection area CP to be electrically connected to the first body portion 402. After repairing, the first connecting portion 202 is only electrically connected to the first electrode 400, and the second connecting portion 204 is only electrically connected to the second electrode 500. Therefore, the light-emitting element 200 can emit a light ray by using a first voltage V1 provided by the first electrode 400 and a second voltage V2 provided by the second electrode 500 and the repairing electrodes 600.

Similar to the embodiment in FIG. 1A to FIG. 1C, in this embodiment, when the light-emitting element 200 has a mounting alignment error, the repairing electrodes 600 can be used to enable the light-emitting element 200 to be correctly connected to an electrode line, so that a manufacturing yield can be increased. In addition, because in this embodiment, the first strip portions 404 are used as the first repairing electrodes 602, the second strip portions 504 are used as the second repairing electrodes 604, and additional floating repairing electrodes do not need to be disposed, so that a cost can be reduced, and the first strip portions 404 and the second strip portions 504 can be disposed in a denser manner, thereby achieving an objective of miniaturization.

Figure 5A:
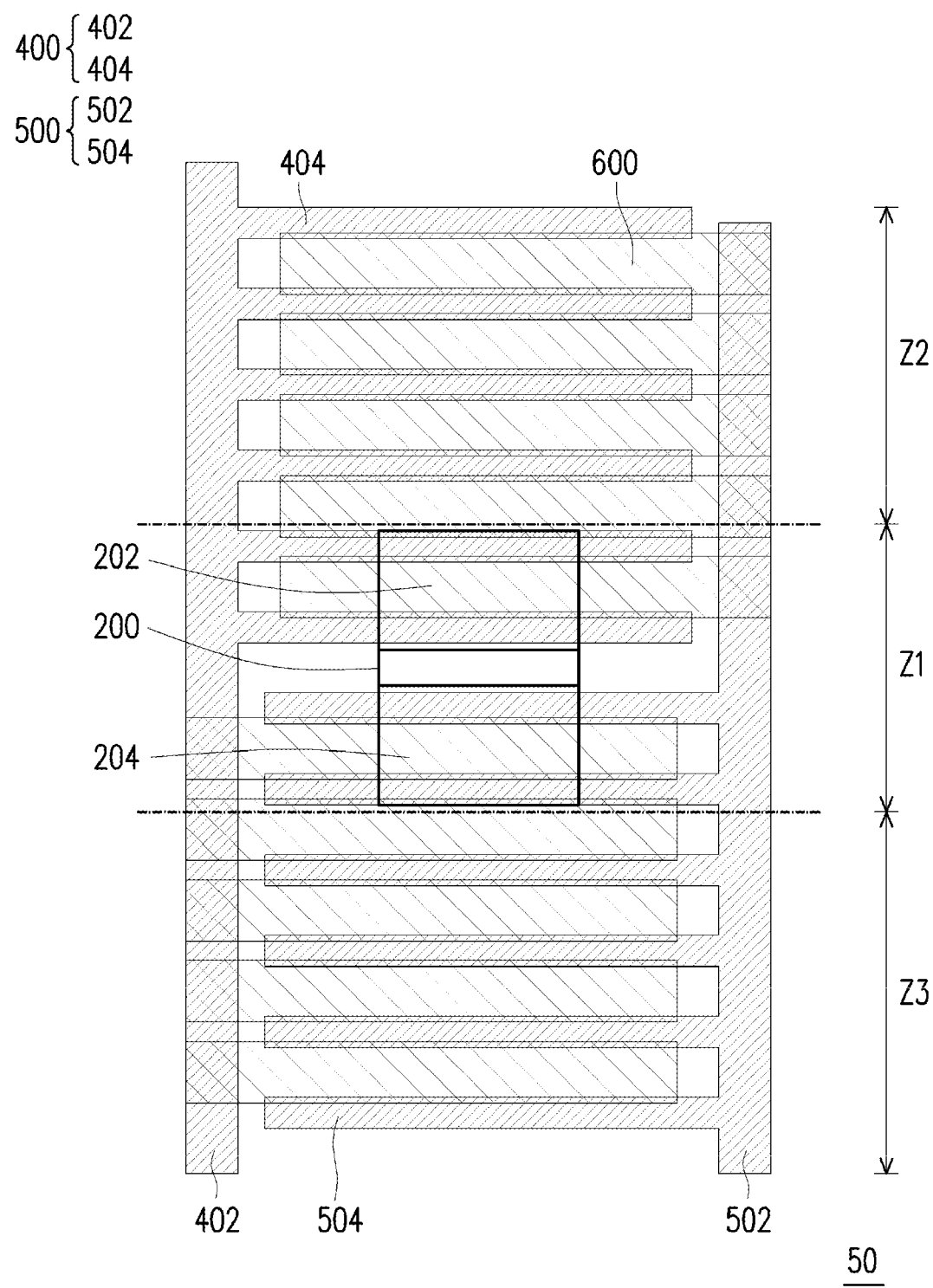
FIG. 5A is a schematic top view of a self-emission type display according to another embodiment of the present invention.
Figure 5B:
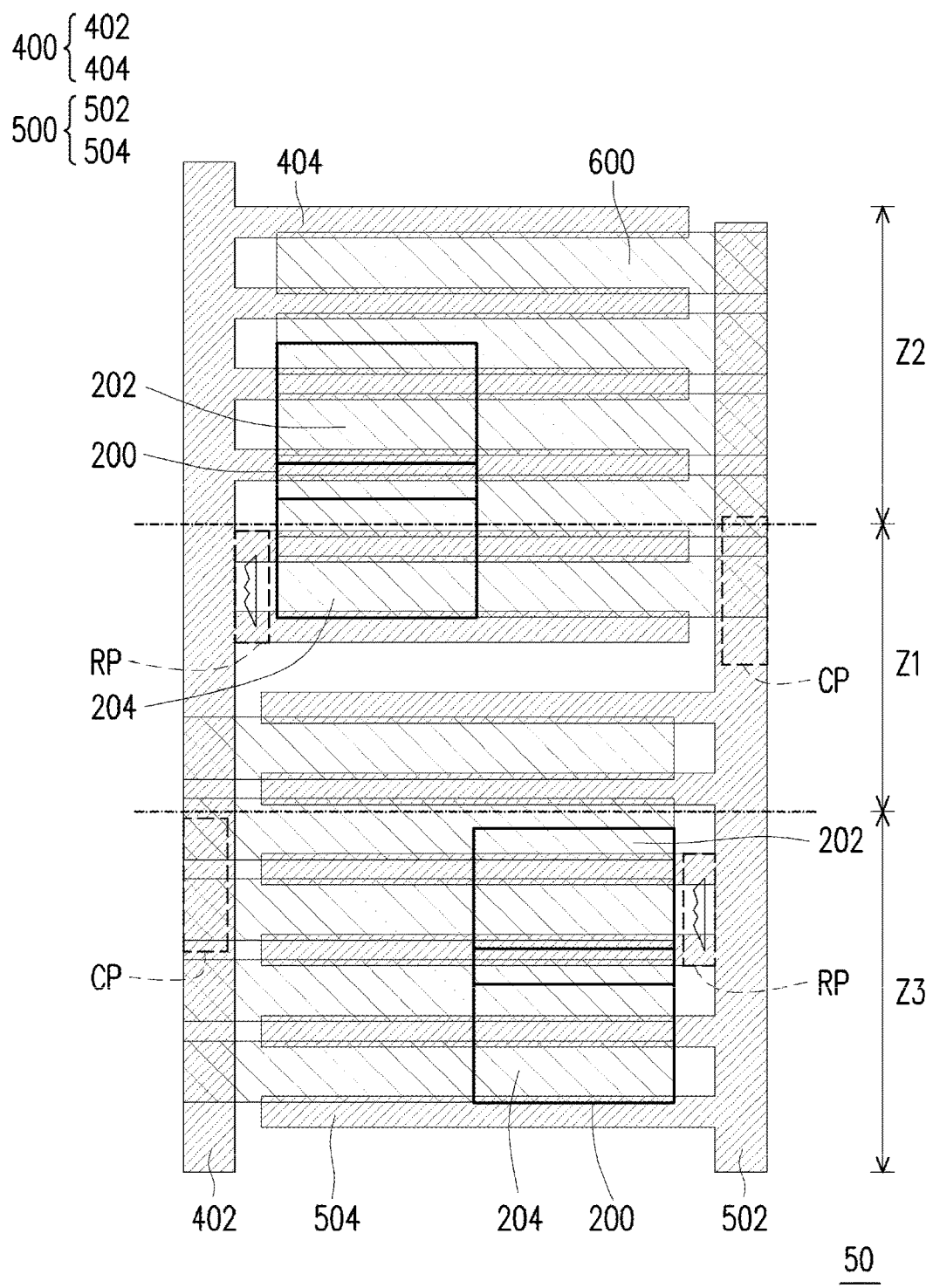
FIG. 5B is a schematic view of a method for repairing the self-emission type display in FIG. 5A.

FIG. 5A is a schematic top view of a self-emission type display 50 according to another embodiment of the present invention. FIG. 5B is a schematic view of a method for repairing the self-emission type display 50 in FIG. 5A. The self-emission type display in this embodiment 50 is similar to the embodiment in FIG. 1A to FIG. 1C, and therefore, the same elements are represented by the same symbols, and description is no longer repeated. A difference between this embodiment and the embodiment in FIG. 1A to FIG. 1C lies in that repairing electrodes 600 in this embodiment and a first electrode 400 are on different film layers, and the repairing electrodes 600 and a second electrode 500 are also are on different film layers. Specifically, in this embodiment, the first electrode 400 and the second electrode 500 are formed simultaneously first, and subsequently, an insulation layer (not shown) is covered on these electrodes, and the repairing electrodes 600 are formed on the insulation layer. The repairing electrodes 600 are partially overlapped with the first electrode 400 and the second electrode 500 respectively, so that when a repairing procedure must be executed, by using a manner of welding, the repairing electrodes 600 can be enabled to penetrate the insulation layer to be electrically connected to the first electrode 400 or the second electrode 500. A repairing manner in this embodiment is described in detail below.

Referring to FIG. 5B, when a light-emitting element 200 is offset to an upward offset area Z2, first strip portions 404 of the first electrode 400 are electrically connected to a first connecting portion 202 and a second connecting portion 204 of the light-emitting element 200 respectively. In such a case, only a first voltage V1 is provided to the light-emitting element 200, and therefore a problem of a short circuit occurs, causing that the light-emitting element 200 cannot successfully emit light. Therefore, the self-emission type display 10 may be repaired by using the repairing electrodes 600. First, a removal procedure is performed first, to enable first strip portions 404 overlapped with the second connecting portion 204 of the light-emitting element 200 to be electrically insulated from the first electrode 400. Specifically, first strip portions 404 in a removal area RP and a first body portion 402 may be cut apart by using a laser cutting procedure, to enable the first strip portions 404 in the removal area RP to be electrically insulated from the first body portion 402. Next, a connection procedure is performed, to enable repairing electrodes 600 overlapped with the second connecting portion 204 of the light-emitting element 200 to be electrically connected to the second electrode 500, and to enable the repairing electrodes 600 overlapped with the second connecting portion 204 of the light-emitting element 200 to be electrically connected to the second connecting portion 204. In this embodiment, the connection procedure includes a laser welding procedure.

Specifically, in the laser welding procedure, an opening may be first formed on the insulation layer (not shown) between the repairing electrodes 600 in a connection area CP and the second electrode 500 by using a laser. Subsequently, a welding procedure is then performed, so as to weld the repairing electrodes 600 and the second body portion 502 in the opening. In another aspect, because the insulation layer is provided between the repairing electrodes 600 and the second connecting portion 204 of the light-emitting element 200, a similar welding procedure also must be executed in an area where the repairing electrodes 600 are overlapped with the second connecting portion 204, to enable the repairing electrodes 600 to be electrically connected to the second connecting portion 204. It should be noted that, in this embodiment, an example in which the removal procedure is performed first and the connection procedure is then performed is used; however, the present invention is not limited thereto. In another embodiment, the connection procedure may also be performed first and the removal procedure is then performed. In addition, in this embodiment, methods of laser cutting and laser welding are used as an example; however, the present invention does not specifically limit manners of connection and removal. Other common manners of connection and removal in this field may also be configured in the present invention.

Similarly, when the light-emitting element 200 is mounted in the downward offset area Z3, the second strip portions 504 of the second electrode 500 are electrically connected to the first connecting portion 202 and the second connecting portion 204 of the light-emitting element 200 respectively. In such a case, only a second voltage V2 is provided to the light-emitting element 200, and therefore a problem of a short circuit occurs, causing that the light-emitting element 200 cannot successfully emit light. Therefore, the self-emission type display 50 may be repaired by using a removal procedure and a connection procedure similar to the foregoing. First, the removal procedure is performed first, to enable second strip portions 504 overlapped with the first connecting portion 202 of the light-emitting element 200 to be electrically insulated from the second electrode 500 in the removal area RP. Next, the connection procedure is performed, to enable repairing electrodes 600 overlapped with the first connecting portion 202 of the light-emitting element 200 to be electrically connected to the first electrode 400 in the connection area CP, and to enable the repairing electrodes 600 overlapped with the first connecting portion 202 to be electrically connected to the first connecting portion 202.

After repairing, the second strip portions 504 of the second electrode 500 is electrically connected to the second connecting portion 204 of the light-emitting element 200, and the first electrode 400 is electrically connected to the first connecting portion 202 through the repairing electrodes 600 welded to the first electrode 400. In other words, after repairing, the first connecting portion 202 is only electrically connected to the first electrode 400, and the second connecting portion 204 is only electrically connected to the second electrode 500. Therefore, the light-emitting element 200 can emit a light ray by using the first voltage V1 provided by the first electrode 400 and the second voltage V2 provided by the second electrode 500 and the repairing electrodes 600.

Similar to the embodiment in FIG. 1A to FIG. 1C, in this embodiment, when the light-emitting element 200 has a mounting alignment error, the repairing electrodes 600 can be used to enable the light-emitting element 200 to be correctly connected to an electrode line, so that a manufacturing yield can be increased. In addition, because the first electrode 400 and the second electrode 500 in this embodiment are on a film layer different from a film layer on which the repairing electrodes 600 is, the first strip portions 404 and the second strip portions 504 can be disposed in a denser manner, thereby achieving an objective of miniaturization.

Figure 6A:
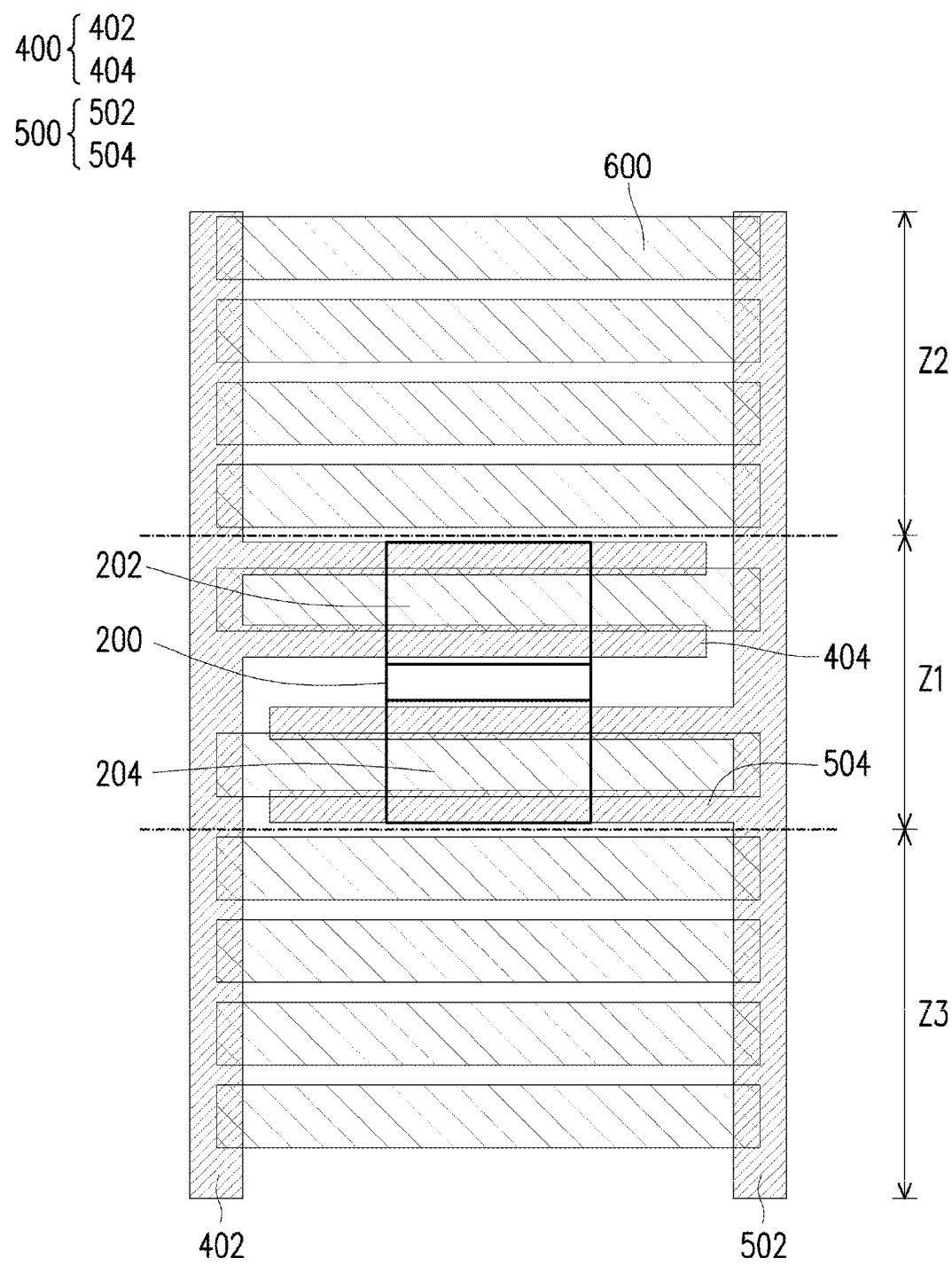
FIG. 6A is a schematic top view of a self-emission type display according to another embodiment of the present invention.
Figure 6B:
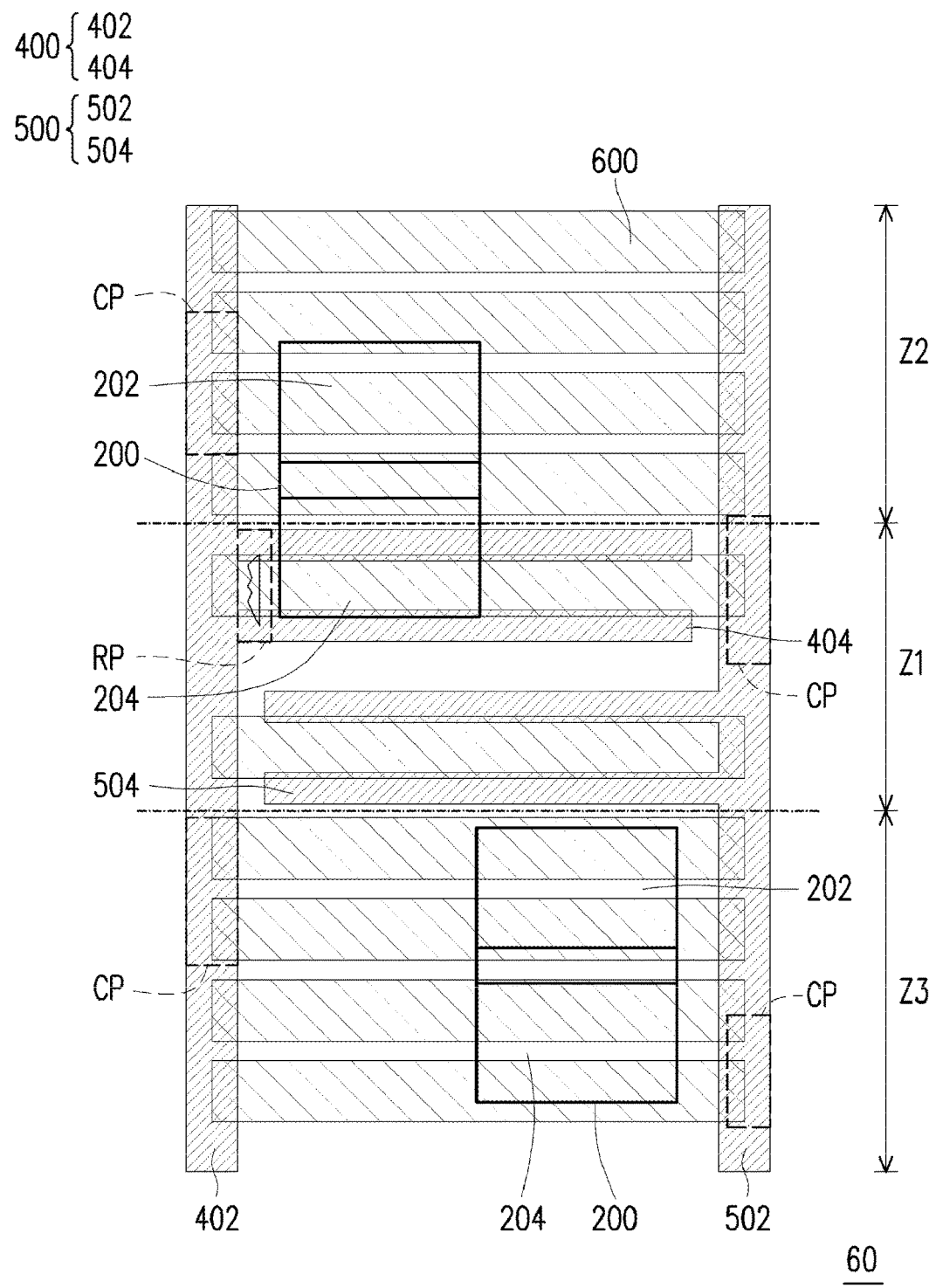
FIG. 6B is a schematic view of a method for repairing the self-emission type display in FIG. 6A.

FIG. 6A is a schematic top view of a self-emission type display 60 according to another embodiment of the present invention. FIG. 6B is a schematic view of a method for repairing the self-emission type display 60 in FIG. 6A. The self-emission type display 60 in this embodiment is similar to the embodiment in FIG. 5A and FIG. 5B, and therefore, the same elements are represented by the same symbols, and description is no longer repeated. A difference between this embodiment and the embodiment in FIG. 5A and FIG. 5B lies in that the first strip portions 404 and the second strip portions 504 in this embodiment are only gathered in the non-offset area Z1. In other words, in the upward offset area Z2 or the downward offset area Z3, the repairing electrodes 600 are not overlapped with the first strip portions 404 or the second strip portions 504. As shown in FIG. 6B, the repairing method in this embodiment is similar to the embodiment in FIG. 5A and FIG. 5B, and is therefore no longer elaborated herein.

Similar to the embodiment in FIG. 6A and FIG. 6B, in this embodiment, when the light-emitting element 200 has a mounting alignment error, the repairing electrodes 600 can be used to enable the light-emitting element 200 to be correctly connected to an electrode line, so that a manufacturing yield can be increased. In addition, because in this embodiment, the first electrode 400 and the second electrode 500 are on a film layer different from a film layer on which the repairing electrodes 600 are, the first strip portions 404 and the second strip portions 504 can be disposed in a denser manner, thereby achieving an objective of miniaturization.

Figure 7A:
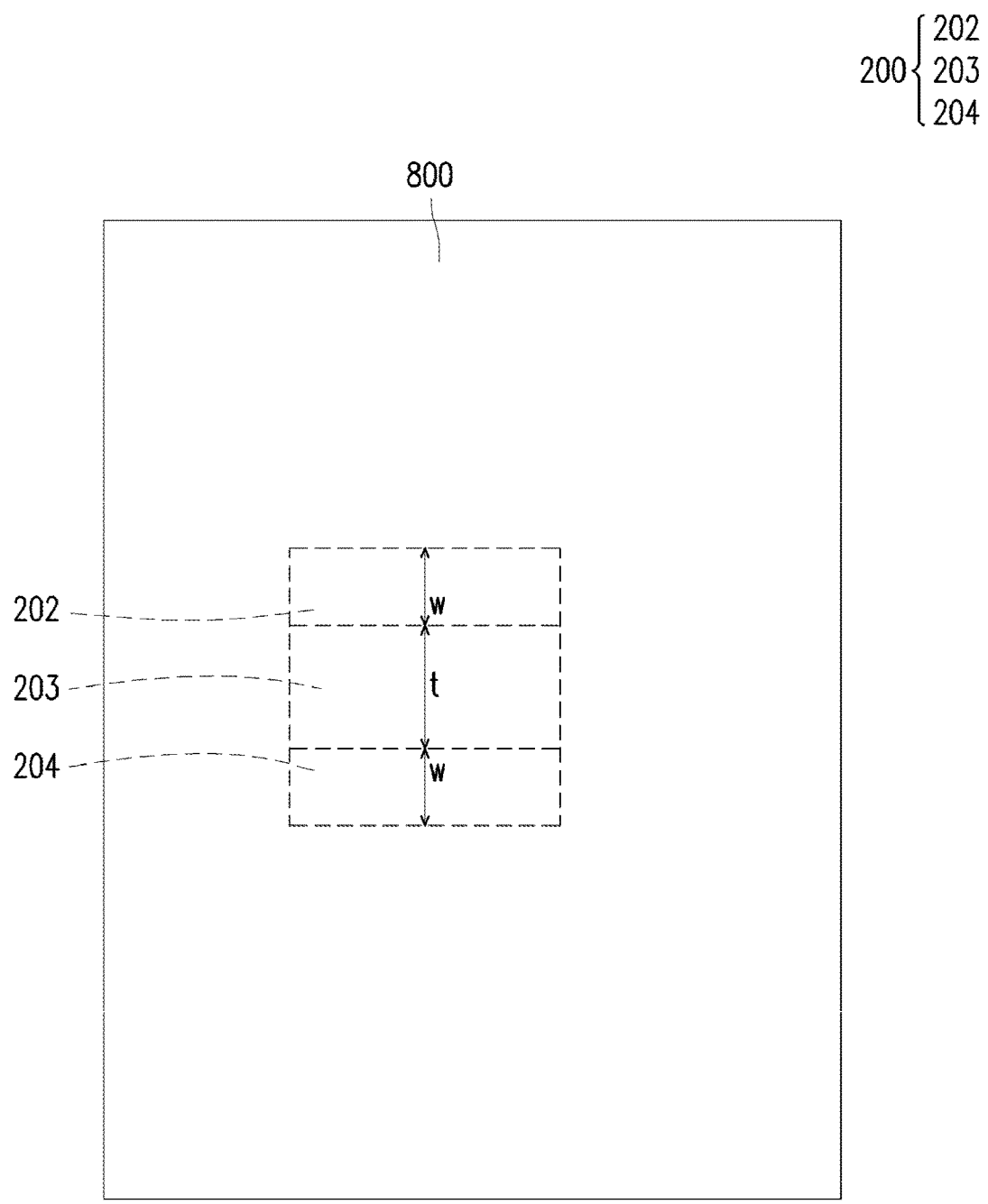
FIG. 7A to FIG. 7G are schematic views of a procedure of manufacturing a self-emission type display according to still another embodiment of the present invention.
Figure 7B:
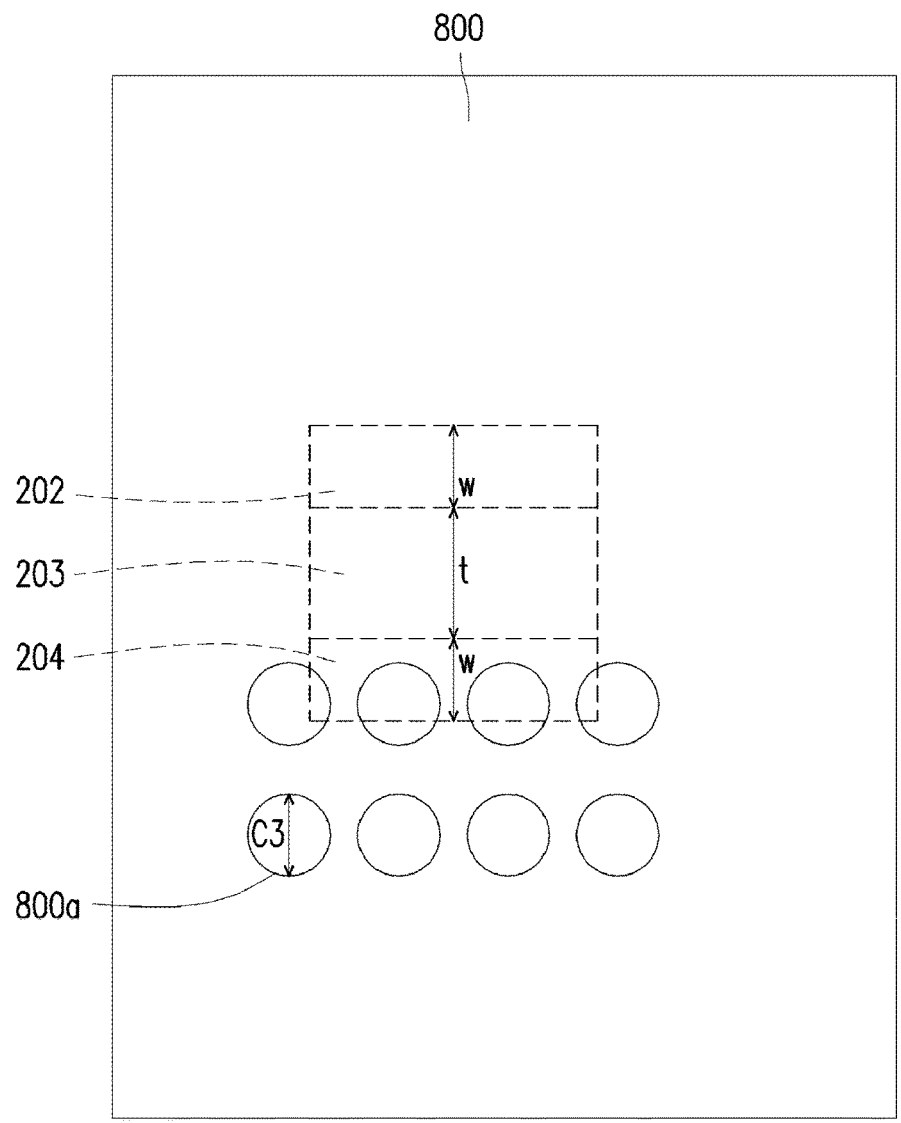
Figure 7C:
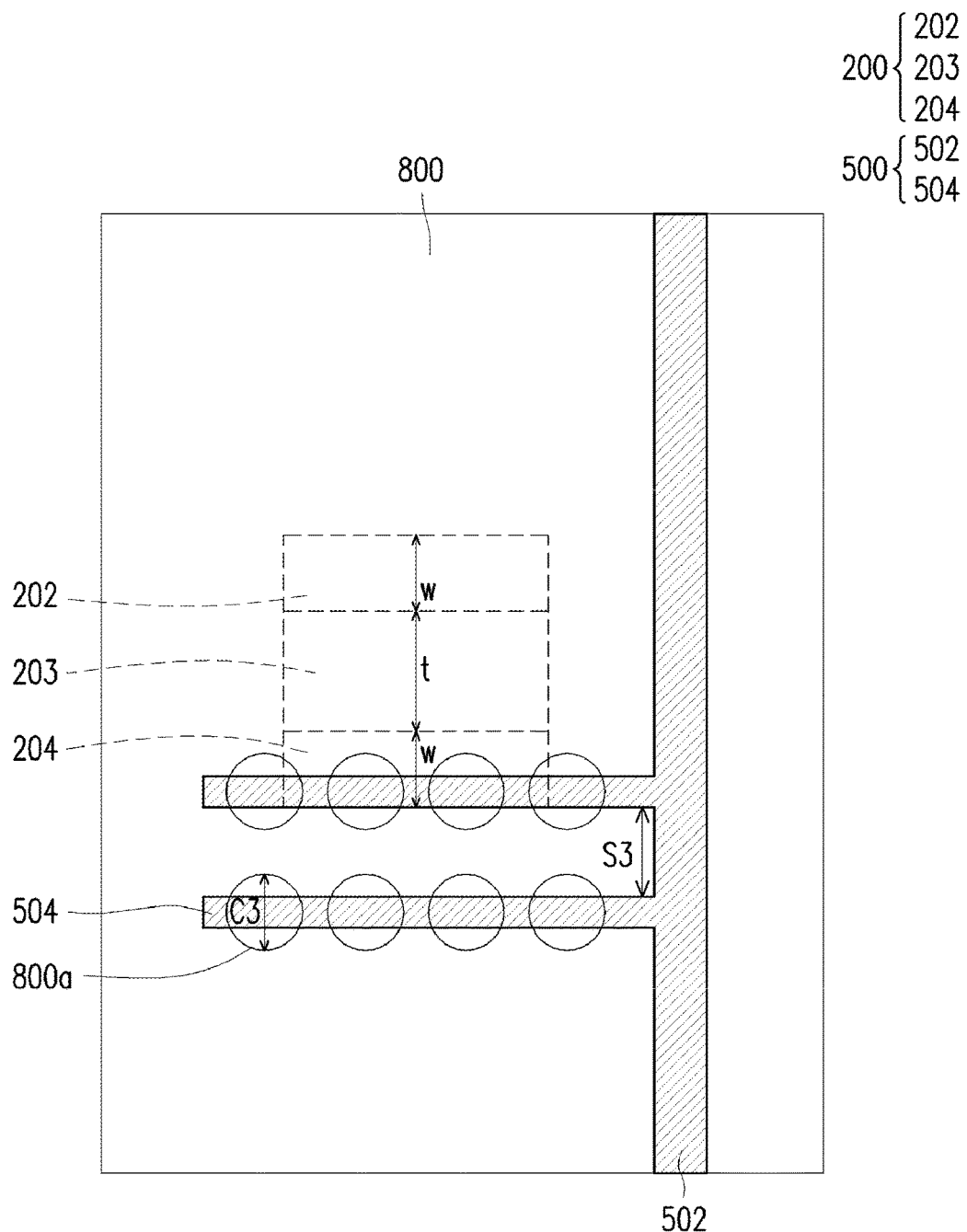
Figure 7D:
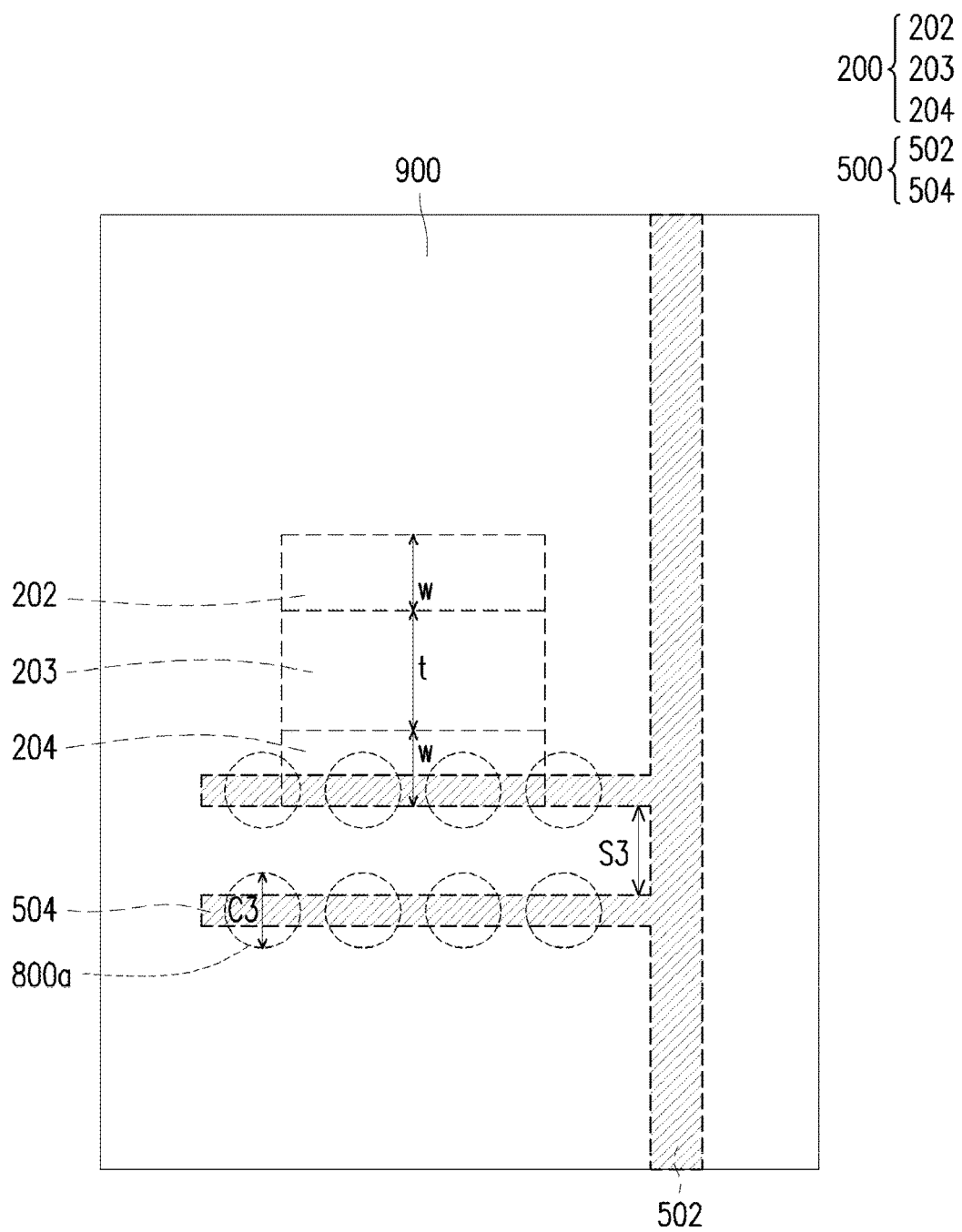

FIG. 7A to FIG. 7G are schematic views of a procedure of manufacturing a self-emission type display 70 according to still another embodiment of the present invention. Referring to FIG. 7A, a light-emitting element 200 is provided first, and a protection layer 800 is formed on the light-emitting element 200. The light-emitting element 200 in this embodiment is similar to the embodiment in FIG. 1A and FIG. 1B, and therefore, the same elements are represented by the same symbols, and description is no longer repeated. It should be noted that, in this embodiment, an insulation portion 203 of the light-emitting element 200 has a width t. Next, a plurality of first contact holes 800a are formed in the protection layer 800, as shown in FIG. 7B. A part of the first contact holes 800a expose a second connecting portion 204 of the light-emitting element 200, and the first contact holes 800a have a diameter C3. Referring to FIG. 7C, a second electrode 500 is formed on the protection layer 800. The second electrode 500 includes a second body portion 502 and a plurality of second strip portions 504. A gap S3 is provided between adjacent second strip portions 504, and the second strip portions 504 are overlapped with the first contact holes 800a. In other words, a part of the second strip portions 504 are electrically connected to the second connecting portion 204 of the light-emitting element 200 through the first contact holes 800a. Next, an insulation layer 900 is formed on the second electrode 500, as shown in FIG. 7D. Materials of the protection layer 800 and the insulation layer 900 may be the same or different, and include an inorganic material (for example, silicon oxide, silicon nitride, silicon nitroxide, another suitable material, or a stack layer of at least two materials of the above), an organic material, or another suitable material, or a combination of the above.

Figure 7E:
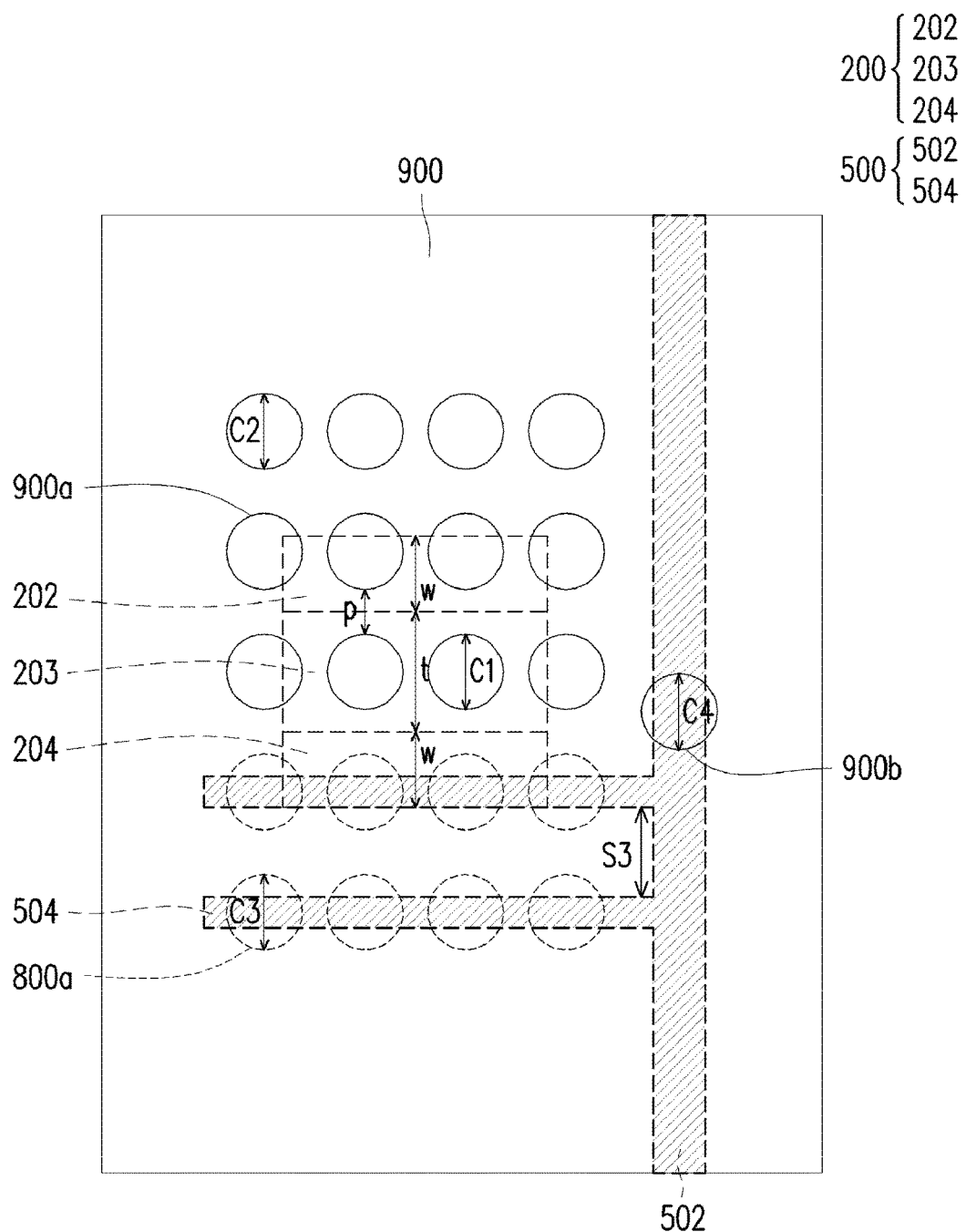
Figure 7F:
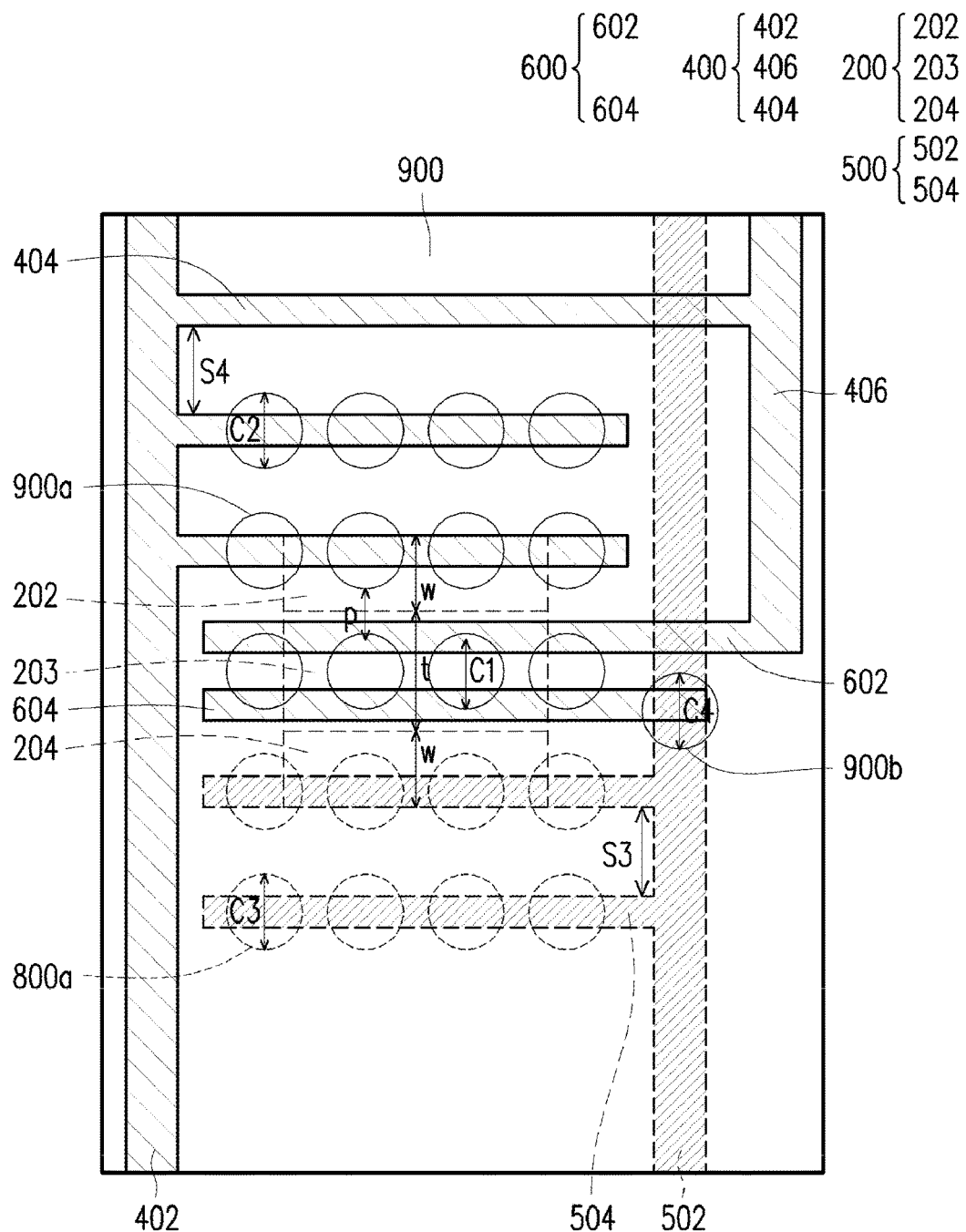
Figure 7G:
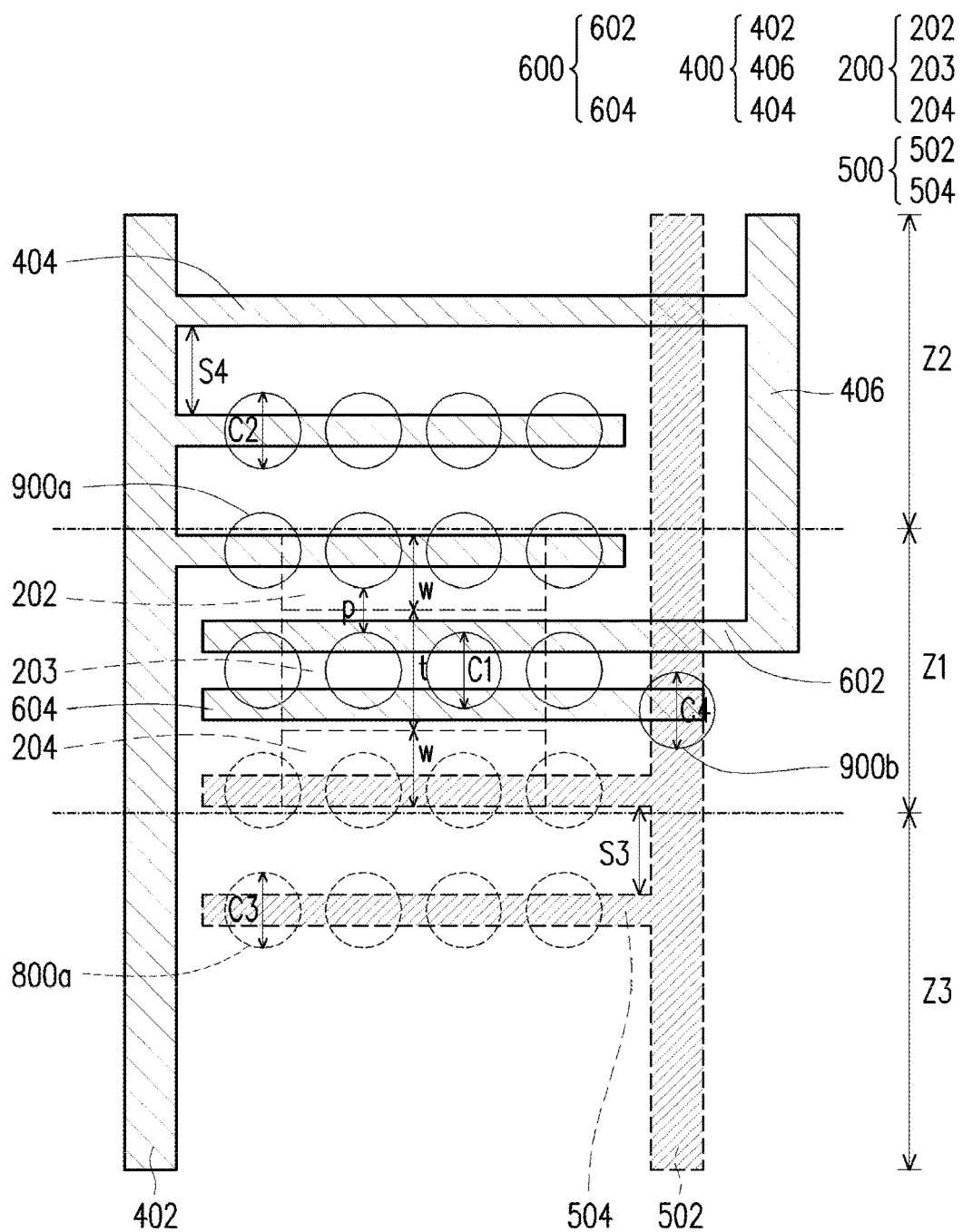

Referring to FIG. 7E, a plurality of second contact holes 900a and a third contact hole 900b are formed in the insulation layer 900. Specifically, the second contact holes 900a penetrate the protection layer 800 and the insulation layer 900, to expose a first connecting portion 202 of the light-emitting element 200. In another aspect, the third contact hole 900b penetrates the insulation layer 900, to expose the second body portion 502 of the second electrode 500. A contact hole gap p is provided between adjacent second contact holes 900a. The first contact holes 800a, the second contact holes 900a, and the third contact hole 900b may be formed by using a manner, for example, laser drilling or lithography; however, the present invention is not limited thereto. Another applicable method for forming a contact window may also be used to form the first contact holes 800a, the second contact holes 900a, and the third contact hole 900b of the present invention. Second contact holes 900a that expose the insulation portion 203 of the light-emitting element 200 have a diameter C1, and the rest second contact holes 900a have a diameter C2. In another aspect, the third contact hole 900b has a diameter C4. It should be noted that, in this embodiment, an example in which the diameters C1, C2, C3, and C4 are all equal is used; however, the present invention is not limited thereto. In another embodiment, the diameters C1, C2, C3, and C4 may also have different sizes respectively. Referring to FIG. 7F, a first electrode 400 and repairing electrodes 600 are formed on the insulation layer 900. Specifically, the first electrode 400 includes a first body portion 402, an auxiliary electrode portion 406, and a plurality of first strip portions 404. A gap S4 is provided between adjacent first strip portions 404. In another aspect, the repairing electrodes 600 include first repairing electrodes 602 and second repairing electrodes 604. The first electrode 400, the first repairing electrodes 602, and the second repairing electrodes 604 are formed simultaneously, and therefore belong to a same film layer. The first repairing electrodes 602 are connected to the auxiliary electrode portion 406. In other words, the first repairing electrodes 602 are electrically connected to the first electrode 400. In another aspect, the second repairing electrodes 604 are separated from the first repairing electrodes 602, and the second repairing electrodes 604 are electrically connected to the second electrode 500 through the third contact hole 900b exposing the second body portion 502. After the step in FIG. 7F is completed, the self-emission type display 70 in this embodiment is approximately completed, as shown in FIG. 7G. It should be noted that, the protection layer 800 and the insulation layer 900 are omitted in FIG. 7G.

Referring to FIG. 7G, the first connecting portion 202 and the second connecting portion 204 of the light-emitting element 200 have a width w respectively, and the insulation portion 203 has a width t. A gap S3 is provided between adjacent second strip portions 504, and a gap S4 is provided between adjacent first strip portions 404. The second contact holes 900a have diameters C1 and C2, the first contact holes 800a have a diameter C3, and the third contact hole 900b has a diameter C4. In this embodiment, the width t is greater than or equal to the diameter C1, to ensure that at least one second contact hole 900a is provided between the first connecting portion 202 and the second connecting portion 204. In another aspect, the contact hole gap p and the gaps S3 and S4 must be greater than 0, to ensure that each second contact hole 900a, each first strip portion 404, and each second strip portion 504 are independent from each other. In addition, in this embodiment, the width w needs to be greater than the contact hole gap p, to ensure that the first connecting portion 202 or the second connecting portion 204 is overlapped with the first contact holes 800a or the second contact hole 900a.

Referring to FIG. 7G again, when the light-emitting element 200 is mounted in the non-offset area Z1, the first strip portions 404 of the first electrode 400 is electrically connected to the first connecting portion 202, and the second strip portions 504 of the second electrode 500 is electrically connected to the second connecting portion 204. In this case, the light-emitting element 200 can emit a light ray under the effect of a first voltage V1 and a second voltage V2.

Figure 7H:
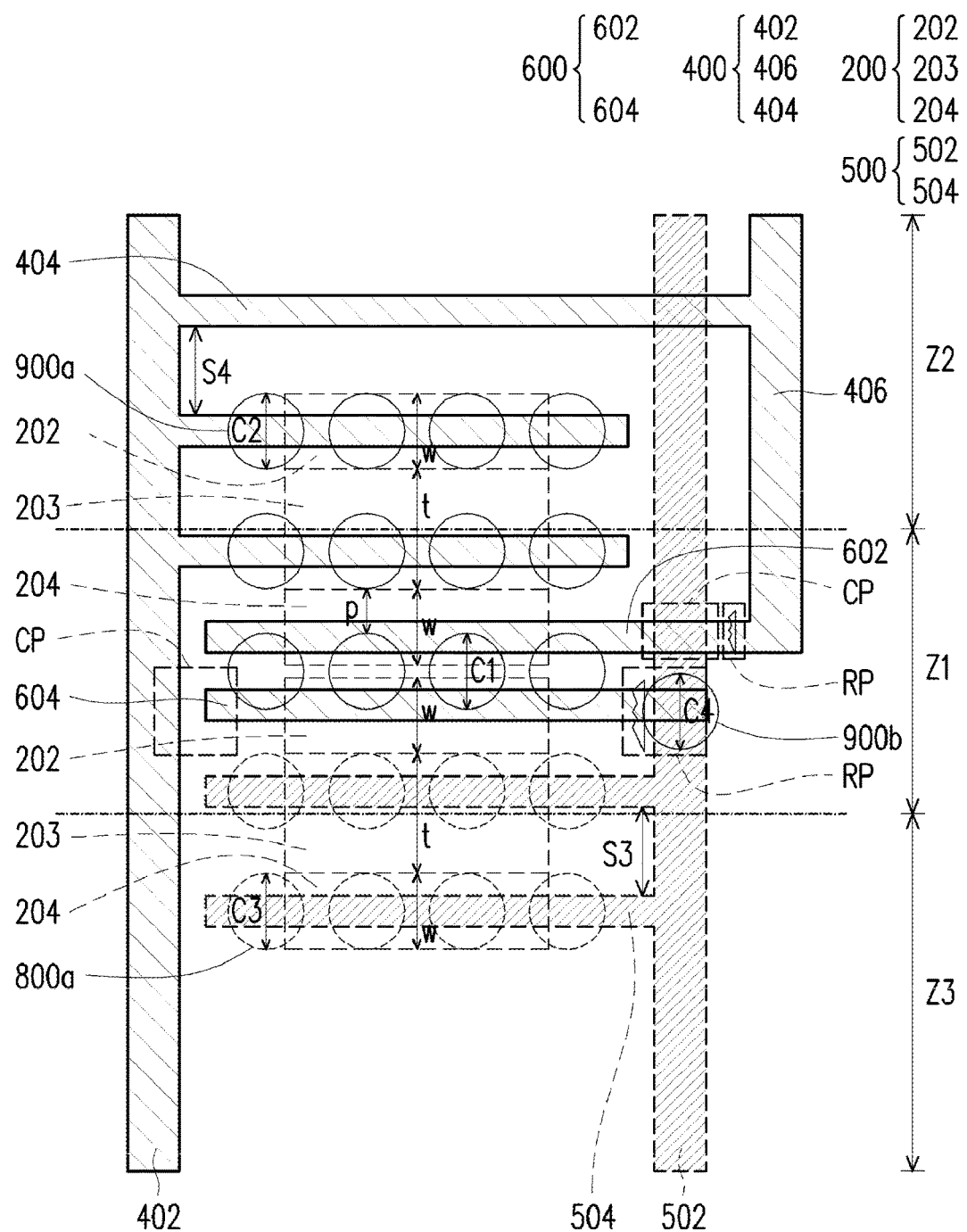
FIG. 7H is a schematic view of a method for repairing the self-emission type display in FIG. 7G.

FIG. 7H is a schematic view of a method for repairing the self-emission type display 70 in FIG. 7G. Referring to FIG. 7H, when the light-emitting element 200 is mounted in the upward offset area Z2 or the downward offset area Z3, an abnormality occurs in the light-emitting element 200, and therefore the self-emission type display 70 can be repaired by using a removal procedure and a connection procedure similar to the foregoing. For example, when the light-emitting element 200 is offset to the upward offset area Z2, the removal procedure is performed first, to enable the first repairing electrodes 602 electrically connected to the second connecting portion 204 of the light-emitting element 200 through a second contact 900a to be electrically insulated from the auxiliary electrode portion 406 in a removal area RP. In another aspect, the connection procedure is performed, to enable the first repairing electrodes 602 to be electrically connected to the second connecting portion 204 of the light-emitting element 200 through the second contact 900a to be electrically connected to the second strip portions 504 of the second electrode 500 in a connection area CP. After repairing, the first strip portions 404 of the first electrode 400 is electrically connected to the first connecting portion 202 of the light-emitting element 200 through the second contact 900a, and the second electrode 500 is electrically connected to the second connecting portion 204 through the first repairing electrodes 602 welded to the second electrode 500 and the second contact 900a. In other words, after repairing, the first connecting portion 202 is only electrically connected to the first electrode 400, and the second connecting portion 204 is only electrically connected to the second electrode 500. Therefore, the light-emitting element 200 can emit a light ray by using a first voltage V1 provided by the first electrode 400 and a second voltage V2 provided by the second electrode 500 and the repairing electrodes 600.

In another aspect, when the light-emitting element 200 is offset to the downward offset area Z3, a removal procedure is performed first, to enable the second repairing electrodes 604 electrically connected to the first connecting portion 202 of the light-emitting element 200 through the second contact holes 900a to be electrically insulated from the second body portion 502 in the removal area RP. In another aspect, the connection procedure is performed, to enable the second repairing electrodes 604 electrically connected to the first connecting portion 202 of the light-emitting element 200 through the second contact holes 900a to be electrically connected to the first body portion 402 of the first electrode 400 in the connection area CP. After repairing, the second strip portions 504 of the second electrode 500 is electrically connected to the second connecting portion 204 of the light-emitting element 200 through the first contact holes 800a, and the first electrode 400 is electrically connected to the first connecting portion 202 through the second repairing electrodes 604 welded to the first electrode 400 and the second contact holes 900a. In other words, after repairing, the first connecting portion 202 is only electrically connected to the first electrode 400, and the second connecting portion 204 is only electrically connected to the second electrode 500. Therefore, the light-emitting element 200 can emit a light ray by using a first voltage V1 provided by the first electrode 400 and a second voltage V2 provided by the second electrode 500 and the repairing electrodes 600.

Similar to the embodiment in FIG. 1A to FIG. 1C, in this embodiment, when the light-emitting element 200 has a mounting alignment error, the repairing electrodes 600 can be used to enable the light-emitting element 200 to be correctly connected to an electrode line, so that a manufacturing yield can be increased. In addition, because in this embodiment, the first strip portions 404 are used as the first repairing electrodes 602, the second strip portions 504 are used as the second repairing electrodes 604, and additional floating repairing electrodes do not need to be disposed, so that a cost can be reduced, and the first strip portions 404 and the second strip portions 504 can become denser, thereby achieving an objective of miniaturization.

In conclusion, because the self-emission type display of the present invention has a plurality of repairing electrodes, when an LED has a mounting alignment error, the repairing electrodes can be used to enable the LED to be correctly connected to an electrode line. Therefore, a scrap rate of self-emission type displays can be reduced, and a manufacturing yield can be increased.

Although the present invention is disclosed above with reference to the embodiments, the embodiments are not used to limit the present invention. Any person of ordinary skill in the art can make several variations and modifications without departing from the spirit and scope of the present invention, and therefore, the protect scope of the present invention should be as defined by the appended claims.

What is claimed is:

1. A self-emission display, comprising:
   a carrier substrate, comprising:
      a first electrode, having a plurality of first strip portions connected to a first level;
      a second electrode, having a plurality of second strip portions connected to a second level, wherein the first electrode is separated from the second electrode, and the first level is different from the second level; and
      a plurality of repairing electrodes; and
   a light-emitting element, disposed on the carrier substrate and directly overlapped at least one of said repairing electrodes, having a first connecting portion and a second connecting portion, wherein the first connecting portion is electrically connected to the first level through the plurality of first strip portions, and the second connecting portion is electrically connected to the second level through the plurality of second strip portions;
   wherein each of said plurality of repairing electrodes is either electrically isolated or electrically connected only via said light-emitting element.

2. The self-emission display according to claim 1, wherein the carrier substrate comprises an active element array substrate, and the active element array substrate provides the first level.

3. The self-emission display according to claim 2, wherein the second level is a common potential (Vss), and the first level is greater than the second level.

4. The self-emission display according to claim 1, wherein at least one of the plurality of first strip portions is located between adjacent the plurality of repairing electrodes.

5. The self-emission display according to claim 4, wherein at least one of the plurality of second strip portions is located between adjacent the plurality of repairing electrodes.

6. The self-emission display according to claim 4, wherein at least one of the plurality of repairing electrodes is located between adjacent the plurality of first strip portions.

7. The self-emission display according to claim 1, wherein at least one of the plurality of repairing electrodes is located between adjacent one of the plurality of first strip portions and one of the plurality of second strip portions.

8. The self-emission display according to claim 1, wherein a distance S1 is provided between at least one of the plurality of repairing electrodes and adjacent one of the plurality of first strip portions, a distance S2 is provided between at least one of the plurality of repairing electrodes and adjacent one of the plurality of second strip portions, and the first connecting portion and the second connecting portion respectively have a width w, wherein w≥S1 and w≥S2.

9. The self-emission display according to claim 1, the second electrode and the plurality of repairing electrodes are on different film layers, and an insulation layer is provided between the second electrode and the plurality of repairing electrodes.

10. The self-emission display according to claim 9, wherein at least one of the plurality of repairing electrodes is partially overlapped with one of a plurality of first electrodes and the second electrode.

* * * * *